United States Patent
Saveliev et al.

(10) Patent No.: US 10,186,369 B2
(45) Date of Patent: Jan. 22, 2019

(54) ELECTRIC SYSTEM WITH CONTROL WINDING AND METHOD OF ADJUSTING SAME

(71) Applicant: Maschinenfabrik Reinhausen GmbH, Regensburg (DE)

(72) Inventors: Anatoli Saveliev, Regensburg (DE); Oliver Sterz, Regensburg (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 0 days.

(21) Appl. No.: 15/550,808

(22) PCT Filed: Feb. 16, 2016

(86) PCT No.: PCT/EP2016/053225
§ 371 (c)(1),
(2) Date: Aug. 14, 2017

(87) PCT Pub. No.: WO2016/135003
PCT Pub. Date: Sep. 1, 2016

(65) Prior Publication Data
US 2018/0033547 A1  Feb. 1, 2018

(30) Foreign Application Priority Data
Feb. 25, 2015 (DE) .................. 10 2015 102 727

(51) Int. Cl.
*H01F 29/04* (2006.01)
*H01S 5/0683* (2006.01)
(Continued)

(52) U.S. Cl.
CPC ......... *H01F 29/04* (2013.01); *H01S 5/06832* (2013.01); *H04B 10/508* (2013.01);
(Continued)

(58) Field of Classification Search
CPC ... G05F 1/14; G05F 1/20; H01F 29/04; H01S 5/06832; H01S 5/042; H01S 5/06213; H01S 5/06835; H04B 10/508; H04B 10/58
See application file for complete search history.

(56) References Cited

U.S. PATENT DOCUMENTS 3,775,702 A * 11/1973 Wallace .............. H02M 3/3388
                                                    331/109
4,716,357 A * 12/1987 Cooper .................... G05F 1/30
                                                    323/263
(Continued)

FOREIGN PATENT DOCUMENTS

DE        2021575 A        12/1971
DE        4231353 A        4/1993
(Continued)

*Primary Examiner* — Yusef A Ahmed
(74) *Attorney, Agent, or Firm* — Andrew Wilford

(57) ABSTRACT

In a method of changing an active winding number of a control winding in an electrical installation, the control winding is coupled to an alternating current mains having a predetermined period duration, the control winding being designed for a predetermined nominal current strength and includes a first and a second tap. Switching is effected, in accordance with a predetermined switching sequence plan from a first continuous current state to a second continuous current state, a load current flowing in the first continuous current state from the first tap to a load output line through a first main path with the second tap isolated from the load output line, the load current flowing in the second continuous current state from the second tap to the load output line through a second main path with the first tap isolated from the load output line.

13 Claims, 11 Drawing Sheets

(51) Int. Cl.
*H04B 10/508* (2013.01)
*H04B 10/58* (2013.01)
*H01S 5/042* (2006.01)
*H01S 5/062* (2006.01)

(52) U.S. Cl.
CPC .............. *H04B 10/58* (2013.01); *H01S 5/042* (2013.01); *H01S 5/06213* (2013.01); *H01S 5/06835* (2013.01)

(56) References Cited

U.S. PATENT DOCUMENTS

| | | | | |
|---|---|---|---|---|
| 5,006,784 | A | * | 4/1991 | Sonntagbauer ......... H01F 29/04 323/343 |
| 5,091,797 | A | | 2/1992 | Proebster |
| 5,604,423 | A | * | 2/1997 | Degeneff ................. G05F 1/20 323/258 |
| 6,906,476 | B1 | * | 6/2005 | Beatenbough ......... H05B 41/40 315/209 R |
| 9,679,710 | B1 | * | 6/2017 | Schaar ................. H01H 9/0033 |
| 2007/0296390 | A1 | * | 12/2007 | Feigin .................... H02M 5/12 323/290 |
| 2009/0140705 | A1 | * | 6/2009 | Dohnal .................... G05F 1/20 323/258 |
| 2009/0146637 | A1 | * | 6/2009 | Stich .................... H01H 9/0005 323/343 |
| 2009/0212758 | A1 | * | 8/2009 | Asinovski ............... H02M 1/10 323/355 |
| 2009/0309536 | A1 | * | 12/2009 | Limor .................... H02P 25/16 318/813 |
| 2010/0148716 | A1 | * | 6/2010 | Yang ........................ H02P 5/74 318/767 |
| 2011/0102056 | A1 | * | 5/2011 | Brueckl .................. H01F 29/04 327/478 |
| 2011/0133817 | A1 | * | 6/2011 | Brueckl .................. H01F 29/04 327/482 |
| 2011/0163703 | A1 | * | 7/2011 | Uang ........................ H02P 9/02 318/400.3 |
| 2012/0313594 | A1 | * | 12/2012 | Brueckl ............... H01H 9/0027 323/258 |
| 2013/0057248 | A1 | * | 3/2013 | Albrecht ................. H01F 29/04 323/340 |
| 2013/0170079 | A1 | * | 7/2013 | Dohnal ................... H01F 29/04 361/40 |
| 2014/0027257 | A1 | * | 1/2014 | Albrecht ................. H01F 29/04 200/5 R |
| 2014/0085028 | A1 | * | 3/2014 | Hammer ................. H01F 29/04 336/150 |
| 2015/0179362 | A1 | * | 6/2015 | Hammer ............... H01H 9/0016 200/11 TC |
| 2016/0018840 | A1 | * | 1/2016 | Strof ....................... H01F 29/04 323/301 |
| 2017/0154738 | A1 | * | 6/2017 | Baeuml ................. H01H 9/0016 |
| 2018/0069492 | A1 | * | 3/2018 | Bieringer ................... H02P 1/12 |

FOREIGN PATENT DOCUMENTS

| | | |
|---|---|---|
| DE | 102007004530 A | 9/2007 |
| DE | 202012101039 A | 8/2013 |
| EP | 2541572 A | 1/2013 |

* cited by examiner

ELECTRIC SYSTEM WITH CONTROL WINDING AND METHOD OF ADJUSTING SAME

CROSS REFERENCE TO RELATED APPLICATIONS

This application is the US-national stage of PCT application PCT/EP2016/053225 filed 16 Feb. 2016 and claiming the priority of German patent application 102015102727.5 itself filed 25 Feb. 2015.

FIELD OF THE INVENTION

The invention relates to a method of changing the active winding number of a control winding in an electrical installation and to an electrical installation with a control winding.

BACKGROUND OF THE INVENTION

EP 2 541 572 A1 describes, on the one hand, an on-load tap changer for connection with a control winding of a transformer. This on-load tap changer comprises a selector and a load changeover switch connected with the selector. The selector comprises a plurality of fixed contacts connected with associated taps of the control winding, two moved contacts and a current collector for each moved contact. Each moved contact is connected by one end with the respective current collector and can be moved longitudinally of the current collector to different positions in which it is electrically connected at its other end with an associated fixed contact. The load changeover switch has two branches each having a series circuit of a main isolating switch and a transition isolating switch as well as a transition resistance connected in parallel with the main isolating switch. Due to this series circuit, this load changeover switch is also termed series load changeover switch. Each branch is connected between an outer contact and an associated current collector. The main isolating switch is switched in such a way that it lies electrically closer to the outer contact than the transition isolating switch. The transition resistances are connected with the outer contact through a common line. The on-load tap changer additionally comprises at least one current detector and fault detector. Each current detector is adapted to detect a current flowing through a path of the load changeover switch and, in response to the detected current, generate a current indication signal. The fault detector is adapted to receive the current indication signal from the current detector, to determine on the basis of the received current indication signal whether a fault has occurred in the load changeover switch and to generate a fault indication signal if it is determined that a fault has occurred in the load changeover switch. The fault detector is adapted to determine whether a transition isolating switch has failed to open in that it determines whether the duration of the current indication signal exceeds a first threshold value. The fault detector is adapted to determine whether a main isolating switch has failed to open in that it determines whether the duration of the current indication signal is shorter than a second threshold value. Each current detector is a current measuring device that with the help of the current indication signal indicates the strength of a detected current and the fault detector is adapted to take into consideration the strength of the detected current in the determination of whether a fault has occurred. The current detector is adapted to detect the current flowing through the common line. The load changeover switch has for each branch a current detector adapted to detect the current flowing through the transition resistance of this branch and for each branch a current detector adapted to detect the current flowing through the transition isolating switch of this branch. The fault detector is adapted to determine whether a transition isolating switch has failed to open in that it checks whether the time period during which a current detection signal is received from the current detector from two branches exceeds a third threshold value. The fault detector is connected with a trigger mechanism of a transformer protective switch so that the transformer, with which the on-load tap changer is connected, can be separated from the mains if a serious fault, typically a fault in a transition isolating switch, should be detected.

EP 2 541 572, on the other hand, describes a method of operating an on-load tap changer with a load changeover switch that has two branches. Each branch comprises a series circuit of a main isolating switch and a transition isolating switch, and a transition resistance connected in parallel with the main isolating switch. This method comprises the steps that at least one path of the load changeover switch is monitored in order to detect current flowing through the path;

a current indication signal is generated in response to the current flowing through the path;

based on the generated current indication signal it is determined whether a fault has occurred in the load changeover switch; and a fault indication signal is generated if it was determined that a fault had occurred in the load changeover switch.

The monitoring embraces at least one path monitored with regard to whether a current flows through a transition resistance. The determination comprises determining whether the duration of a received current indication signal exceeds a first threshold value and is shorter than a second threshold value.

The method comprises the step of determining the strength of a detected current. The determination of whether a fault has occurred is carried out in dependence on the determined magnitude of the detected current. The monitoring of at least one path comprises monitoring for each branch whether a current flows through transition isolating switch of that branch. The determination whether a fault has occurred comprises checking whether a time period during which a current indication signal from the current detector is received from two branches exceeds a third threshold value. The threshold values are predetermined.

EP 2 541 572 A1 describes that the on-load tap changer for changing the active winding number of the transformer switches over from a first continuous current state to a second continuous current state. In the first continuous current state the current flows from the first tap through the first moved contact, the first current collector and the first transition isolating switch and first main isolating switch of the first branch to the outer contact and a second tap is separated from the outer contact. In the second continuous current state the current flows from a second tap through the second moved contact, the second current collector and the second transition isolating switch and second main isolating switch of the second branch to the outer contact and the first tap is separated from the outer contact. Starting from the first continuous current state the first main isolating switch is opened so that the current now flows through the first transition resistance of the first branch as well as the first transition isolating switch. Thereafter, the second transition isolating switch is closed so that the load changeover switch now has two completed branches for the current flow, in which case the flow in each branch is limited by a transition resistance. Thereafter, the first transition isolating switch is opened so that now the entire current flows through the second transition resistance and the second transition isolating switch and still remains limited by the second transition resistance. Finally, the second main isolating switch is closed so that now the current flows through the second main isolating switch and the second transition isolating switch and the second continuous current state is reached.

Thus, each series circuit of transition isolating switch and main isolating switch forms a main path and each series circuit of transition isolating switch and transition resistance, which is connected in parallel with the main isolating switch, forms a transition path.

DE 20 21 575 describes a load changeover switch with two branches each having a parallel circuit of a first vacuum interrupter and a series circuit of a transition resistance and a second vacuum interrupter. Due to this parallel circuit this load changeover switch is also termed parallel load changeover switch. In each branch the first vacuum interrupter forms a main path and the series circuit forms a transition path.

DE 42 31 353 describes a load changeover switch with two vacuum interrupters, a transition resistance and a changeover switch that comprises two changeover contacts and a middle contact. The first vacuum interrupter is connected between middle contact and load output line. The first changeover contact is connected with a first moved contact of a selector and the second changeover contact is connected with a second moved contact. A series circuit of transition resistance and second vacuum interrupter is connected between second moved contact and load output line and thus parallel to the first vacuum interrupter, middle contact and second changeover contact. The first vacuum interrupter, the middle contact and the first changeover contact form a first main path, the series circuit forms a transition path, and the first vacuum interrupter, the middle contact and the second changeover contact form a second main path.

DE 42 31 353 A1 additionally describes a load changeover switch with two branches, of which one comprises a first vacuum interrupter and the other a parallel circuit of a second vacuum interrupter and a series circuit of a transition resistance and a third vacuum interrupter. The first vacuum interrupter forms a first main path, the series circuit forms a transition path and the second vacuum interrupter forms a second main path.

DE 10 2007 004 530 A1 describes a load changeover switch with three vacuum interrupters, two transition resistances and a changeover switch that comprises two changeover contacts and a middle contact. The first vacuum interrupter is connected between middle contact and load output line. The first changeover contact is connected with a first moved contact of a selector and the second changeover contact is connected with a second moved contact. A first series circuit of first transition resistance and second vacuum interrupter is connected between first moved contact and load output line and thus parallel to first vacuum interrupter, middle contact and first changeover contact. A second series circuit of second transition resistance and third vacuum interrupter is connected between second moved contact and load output line and thus parallel to first vacuum interrupter, middle contact and second changeover contact. The first vacuum interrupter, the middle contact and the first changeover contact form a first main path, the first series circuit forms a first transition path, the second series circuit forms a second transition path and the first vacuum interrupter, the middle contact and the second changeover contact form a second main path.

SUMMARY OF THE INVENTION

According to a first aspect the invention proposes a method of changing the active winding number of a control winding in an electrical installation, wherein
  the control winding is coupled to an alternating current mains with a predetermined period duration T, is designed for a predetermined nominal current strength IN and comprises a first and a second tap;
  switching over takes place in accordance with a predetermined switching sequence plan from a first continuous current state, in which a load current flows from the first tap to a load output line through a first main path and the second tap is separated from the load output line, to a second continuous current state, in which the load current flows from the second tap to the load output line through a second main path and the first tap is separated from the load output line;
the switching sequence plan prescribes that
  starting from the first continuous current state in a switching step a the first tap is or remains connected with the load output line through a first transition path and the first main path is isolated;
  in a switching step b after switching step a the second tap is connected with the load output line through a second transition path so that a circular current iK flows through the transition paths due to the step voltage between the taps;
  in a switching step c after switching step b the first tap is separated from the load output line; and
  in a switching step d after switching step c the second tap is connected with the load output line through the second main path;
  at at least one predetermined test instant tT between switching step a and switching step c it is tested whether the first main path is isolated;
  a current strength IL of the load current is determined; and
  the test instant tT depends on the load current strength IL.

Correct isolation of the first main path is thus monitored by this proposed method.

This method enables simple adaptation to different load current strengths and thus different operational states as well as fault monitoring, which is simple to realize and reliable, of the current separations required during changing of the active winding number.

Moreover, this method enables use of a current sensor that has a desired—for example non-linear and/or monotonic—transfer function and/or a desired—for example non-linear and/or monotonic—measuring characteristic curve and/or a low accuracy and/or a poor time stability and/or a fluctuating or imprecisely defined detection threshold value and/or supplies a simple ON/OFF measurement signal depending on whether or not the instantaneous current strength of the current to be detected exceeds the detection threshold value of the current sensor. A current sensor of that kind comprises, for example, a saturation current transducer and is thus of very simple construction and therefore also very advantageous in terms of cost. The current sensor advantageously has a sufficiently good time resolution of, for example, better than 0.01 T or 0.005 T or 0.002 T or 0.001 T that does not, however, represent a problem for currently available current sensors.

Moreover, this method is suitable not only for electrical installations comprising a series load changeover switch, but also for electrical installations comprising a load changeover switch constructed differently from a series load changeover switch. Differently constructed load changeover switches of that kind can comprise, for example, only one transition resistance, transition chokes instead of transition resistances, more than or less than four isolating switches or two parallel isolating switches in one branch.

The separation of the first tap from the load output line in switching step c preferably comprises isolation of the first transition path.

The load current strength can be selected as desired according to need, for example as the amplitude of the load current if this is sinusoidal, or the peak value of the load current if this is an alternating variable, or the effective value of the load current if this is an alternating variable, or the peak/valley value of the load current if this has a desired periodic course, or the maximum value of the load current if this has a desired periodic course or as a mean value of one of the foregoing variables.

This mean value, also termed mean load current strength, can be selected as desired according to need, for example as a median or an arithmetic mean or geometric mean or harmonic mean or square mean or cubic mean or logarithmic mean and can be, for example, supported or winsorised or weighted or smoothed according to need.

The determination of the mean load current strength can be carried out in any desired mode and manner according to need, for example through at least one period duration and/or through at most 10 period durations and/or before or after generation of a switching signal for switching over from the first continuous current state to the second continuous current state. This switching signal is generated by, for example, a control device of the installation.

In an exemplifying installation that comprises a regulating transformer with a primary side and a secondary side and in which the control winding forms at least a part of the primary side or the secondary side, this control device comprises, for example, a voltage regulator whose purpose is to keep the primary voltage or the secondary voltage of the regulating transformer in a predetermined voltage band.

In an exemplifying installation that comprises a controllable or variable compensation choke for supplying inductive reactive power to the alternating current mains and/or for compensation for capacitive reactive power from the alternating current mains and in which the control winding forms at least a part of the compensation choke, this control device comprises, for example, a reactive power regulator whose purpose is to set the reactive power—that is to be supplied by the compensation choke and/or for which compensation is to be provided—and/or to keep the reactive power of the alternating current mains in a predetermined reactive power band.

Each of these two installations comprises, for example, an on-load tap changer that is coupled to the control device and connected with the control winding, with a load changeover switch and a fine selector that for the control winding comprises two moved contacts and for each tap a fixed contact electrically conductively connected therewith. In the case of an on-load tap changer of that kind the power-free or current-free or load-free preselection of the current-free fixed contact of the second tap, which is to be switched over to, is carried out with the help of that moved contact of the fine selector which does not lie at the current-contacting fixed contact of the first tap through which the load current flows, and is current-free or non-current-conducting, and the actual switching over under load takes place from the other moved contact, which lies at the current-conducting fixed contact and is current-conducting, to the current-free moved contact in the load changeover switch. In this embodiment the switching signal contains, for example, information about which moved contact of the fine selector is to be moved and which fixed contact of the fine selector is to be connected by this moved contact to be moved.

Determination of the load current strength is preferably carried out before switching step a.

This method is preferably designed to be symmetrical so that when switching over takes place in the reverse direction, thus from the second to the first continuous current state, correct isolation of the second main path is monitored in analogous manner.

Preferably it is provided that the testing comprises detecting the current $i1$ flowing in the first main path and comparing it with a predetermined detection threshold value; and evaluating the test result as positive if the threshold value is fallen below and otherwise evaluating it as negative.

Preferably it is provided that the test instant $tT$ lies at a predetermined delay time TV after the start of the switching step a.

Preferably it is provided that the test instant $tT$ is before the switching step b.

Preferably it is provided that prior to the testing and, in particular, prior to the switching step a the load current strength IL is compared with a predetermined mode threshold value; and if the threshold value is exceeded the testing is carried out in accordance with a mode A and otherwise in accordance with a mode B or if the threshold value is fallen below the testing is carried out in accordance with a mode B and otherwise in accordance with a mode A.

Preferably it is provided that the mode threshold value depends on the detection threshold value and/or the lower threshold value and/or the nominal current strength IN and/or the circular current strength IK; and/or is greater than or equal to the detection threshold value and/or the lower threshold value; and/or is greater by at most a predetermined proportion than the detection threshold value and/or the lower threshold value, this proportion preferably being 5% or 7% or 10% or 12% or 15% or 20% or 25% or 30% or 35% or 40% or 45% or 50% or 60% or 80% or 100% or 120% or 150% or 200% or 250% or 300%; and/or is smaller than the upper threshold value; and/or is smaller than or equal to a predetermined proportion of the circular current strength IK, this proportion preferably being 60% or 50% or 40% or 30% or 25% or 20% or 17% or 15% or 12% or 11% or 10% or 7% or 5%;

is smaller than or equal to a predetermined proportion of the nominal current strength IN, this proportion preferably being 25% or 20% or 17% or 15% or 12% or 11% or 10% or 7% or 5%.

Test Mode A:

Preferably it is provided that in mode A the test instant $tT$ is before the switching step b.

Test Mode B:

Preferably it is provided that in mode B the test instant $tT$ lies after switching step b.

Preferably it is provided that the testing comprises detecting the current $i2$ flowing in the first transition path and comparing it with a predetermined lower circular current threshold value; and evaluating the test result as positive if the threshold value is exceeded and otherwise evaluating it as negative.

Preferably it is provided that the test comprises detecting the current i3 flowing in the second transition path or through the first or second tap and comparing it with a predetermined upper circular current threshold value; and evaluating the test result as positive if the threshold value is fallen below and otherwise evaluating it as negative.

Preferably it is provided that the lower circular current threshold value depends on the nominal current strength IN and/or the circular current strength IK and/or the load current strength IL; and/or on the resistance value of a first transition resistance connected into the first transition path and/or on the resistance value of a second transition resistance connected into the second transition path;

is smaller than or equal to a predetermined proportion of the circular current strength IK, this proportion preferably being 60% or 50% or 40% or 30% or 25% or 20% or 17% or 15% or 12% or 11% or 10% or 7% or 5%;

is smaller than or equal to a predetermined maximum proportion of the nominal current strength IN and/or greater than or equal to a predetermined minimum proportion of the nominal current strength IN, the maximum proportion preferably being 60% or 55% or 50% or 45% or 40% or 35% or 30% and/or the minimum proportion preferably being 50% or 45% or 40% or 35% or 30% or 25% or 20%.

Preferably it is provided that the upper circular current threshold value depends on the nominal current strength IN and/or the circular current strength IK and/or the load current strength IL; and/or depends on the resistance value of a first transition resistance connected into the first transition path and/or on the resistance value of a second transition resistance connected into the second transition path;

is greater than the lower circular current threshold value; and/or is smaller than or the equal to a predetermined proportion of the circular current strength IK, this proportion preferably being 90% or 80% or 70% or 60% or 55% or 50% or 45% or 40%;

is smaller than or equal to a predetermined proportion of the nominal current strength IN, this proportion preferably being 80% or 75% or 70% or 65% or 60% or 55% or 50% or 45% or 40% or 35% or 30% or 25% or 20%.

Preferably it is provided that the test instant tT lies at a predetermined delay time TV after the start of the switching step b.

General subclaims for main path.

Preferably it is provided that the test instant tT and/or the delay time TV depends or depend on the first zero transition tN of the load current since the start of the switching step a.

Preferably it is provided that the testing takes place at a test time interval TT extending from the first zero transition tN of the load current since the start of the switching step a to the test instant tT; and/or the testing takes place after or from the first zero transition tN of the load current since the start of the switching step a and up to the test instant tT.

According to a second aspect the invention proposes a method, which is formulated particularly in accordance with the first aspect, for changing the active winding number of a control winding in an electrical installation, wherein the control winding is coupled to an alternating current mains with a predetermined period duration T, is designed for a predetermined nominal current strength IN and comprises a first and a second tap;

switching over takes place in accordance with a predetermined switching sequence plan from a first continuous current state, in which a load current flows from the first tap to a load output line through a first main path and the second tap is separated from the load output line, to a second continuous current state, in which the load current flows from the second tap to the load output line through a second main path and the first tap is separated from the load output line;

the switching sequence plan prescribes that starting from the first continuous current state in a switching step a the first tap is or remains connected with the load output line through a first transition path and the first main path is isolated;

in a switching step b after switching step a the second tap is connected with the load output line through a second transition path so that a circular current iK flows through the transition paths due to the step voltage between the first and second taps;

in a switching step c after switching step b the first tap is separated from the load output line; and in a switching step d after switching step c the second tap is connected with the load output line through the second main path;

at at least one predetermined test instant tT between switching step c and switching step d it is tested whether the first main path is isolated;

a current strength IL of the load current is determined; and the test instant tT depends on the load current strength IL.

Correct isolation of the first transition path is thus monitored by this proposed method.

Preferably, the first tap is separated from the load output line by the isolation of the first transition path in switching step c or the first tap is separated from the load output line between switching steps c and d.

This method is preferably designed to be symmetrical so that in the case of switching over in the reverse direction, thus from the second to the first continuous current state, correct isolation of the second transition path is monitored in analogous manner.

The separation of the first tap from the load output line preferably takes place either in switching step c or between switching steps c and d.

For preference it is provided that the testing comprises detecting the current i2 flowing in the first transition path and comparing it with a predetermined detection threshold value; and evaluating the test result as positive if the threshold value is fallen below and otherwise evaluating it as negative.

If at least two test results are present, for example a test result from testing the current i1 in the first main path and/or a test result from testing the current i2 in the first transition path and/or a test result from testing the current i3 in the second transition path or through the first or second tap then for preference an overall test result is evaluated as negative if even only one of the test results should be negative and/or the overall test result is evaluated as positive as long as all rest results are positive and/or not negative.

Preferably it is provided that the test instant tT lies at a predetermined delay time TV after the start of the switching step c.

For preference it is provided that the test instant tT lies in front of or shortly after switching step d.

The time span by which the test instant tT lies shortly after switching step d advantageously depends on the design of the transition resistances.

Preferably it is provided that the test instant tT and/or the delay time TV depends or depend on the first zero transition tN of the load current since the start of the switching step c.

Preferably it is provided that testing is carried out in a test time interval TT extending from the first zero transition tN of the load current since the start of the switching step c to the test instant tT; and/or testing is carried out after or from the first zero transition tN of the load current since the start of the switching step c and up to the test instant tT.

Preferably it is provided that the switching sequence plan prescribes that in switching step a the first main path is isolated in that a first isolating switch in the first main path is opened; and/or in switching step c the first tap is separated from the load output line in that the first transition path is isolated, particularly in that a second isolating switch in the first transition path is opened; and/or during/after switching step d the second continuous current state is reached.

Preferably it is provided that the testing of the first main path is carried out in that the opening of the first isolating switch is tested; and/or the testing of the first transition path is carried out in that the opening of the second isolating switch is tested; and/or at least one of the isolating switches is formed as an oil switch or as a vacuum interrupter; and/or at least one of the isolating switches is actuated with the help of a direct drive.

As direct drive there is understood here a drive that is known for, for example, an on-load tap changer with a plurality of isolating switches and that, for example, comprises for each isolating switch an individual separate motor whose movement produces directly and/or immediately and/or free of delay a movement and/or an actuation of the respective isolating switch, or comprises for each at least two isolating switches or for each group of at least two isolating switches a common control transmission and a common motor whose movement produces directly and/or immediately and/or free of delay a movement and/or an actuation of the respective common control transmission. A direct drive thus enables, in simple manner, a positive and negative acceleration up to direction reversal of the movement of the associated isolating switches or control transmission.

By contrast, for an on-load tap changer with a plurality of isolating switches there is known a drive that comprises for all isolating switches a common motor, a common spring energy store and a common control transmission. The control transmission usually comprises a cam disk that is driven by the motor and whose cam is scanned by the isolating switches, so that these are actuated in a time sequence predetermined by the form of the cam. The spring energy store is so coupled at the input side to the motor and at the output side to the control transmission that the movement of the motor in fact directly and immediately produces a movement of the spring energy store so that the spring thereof is stressed, but that the control transmission and the cam disk and thus also the isolating switches are not moved during this stressing phase. Only after the spring has reached a predetermined stress is the spring energy store released so that the spring abruptly relaxes and just this movement of the spring directly and immediately produces a correspondingly rapid movement of the control transmission and of the cam disk.

Preferably it is provided that changing of the active winding number is carried out with the help of an on-load tap changer connected with the taps of the regulating transformer.

Preferably it is provided that the on-load tap changer is driven with the help of a rotary drive; and/or comprises at least one isolating switch.

For preference it is provided that the delay time TV depends on the load current strength IL.

The delay time TV depends on the load current strength IL in a way preferably diminishing in monotonic or antitonic manner.

For preference it is provided, particularly in mode A, that the load current strength IL is compared with a predetermined upper threshold value; and the delay time tV is set to a predetermined value TV1 in the case of exceeding the threshold value and otherwise is set to a predetermined value TV2>TV1.

The comparison of the load current strength IL with the upper threshold value is preferably carried out prior to switching step a or b, in mode A preferably before switching step a and in mode B preferably before switching step a or b.

Preferably it is provided, particularly in mode A, that

TV1 and/or TV2 depends or depend on the load current strength IL and/or on a isolation duration DT of the isolation.

As isolation duration of a path there is to be understood the time needed for complete isolation of this path. If, for example, this isolation takes place with the help of an isolating switch then the isolation duration is determined by the time needed for complete opening of the isolating switch.

Preferably it is provided, particularly in mode A, that a first time buffer TY1 and a second time buffer TY2>TY1 are predetermined;

TV1=T/2+D1, wherein D1=DT+TY1;

TV2=T/2+D2, wherein D2=DT+TY2.

Preferably is provided, particularly in mode A, that prior to the testing, the load current strength IL is compared with a predetermined lower threshold value; and the testing is performed if the threshold value is exceeded, but otherwise an appropriate emergency plan is executed and, in particular, the testing is not performed.

The comparison of the load current strength IL with the lower threshold value preferably takes place before switching step a or b, in mode A preferably before switching step a and in mode B preferably before switching step a or b.

For preference it is provided, particularly in mode A, that the detection threshold value is at most a predetermined proportion of the nominal current strength IN, this proportion preferably being 20% or 15% or 12% or 11% or 10% or 7% or 5% or 2% or 1%.

Preferably, it is provided, particularly in mode A, that the upper threshold value depends on the detection threshold value and/or the nominal current strength IN and/or the circular current strength IK; and/or is greater than the detection threshold value; and/or is greater than or equal to a predetermined multiple of the detection threshold value, this multiple being 2 or 2.5 or 3 or 3.5 or 4 or 4.5 or 5 or 6 or 7; and/or is smaller than or equal to a predetermined proportion of the circular current strength IK, this proportion preferably being 90% or 80% or 70% or 60% or 55% or 50% or 45% or 40%;

is smaller than or equal to a predetermined maximum proportion of the nominal current strength IN and/or is greater than or equal or a predetermined minimum proportion of the nominal current strength IN, the maximum proportion preferably being 75% or 70% or 65% or 60% or 55% or 50% or 45% or 40% or 35% or 30% and/or the minimum proportion preferably being 65% or 60% or 55% or 50% or 45% or 40% or 35% or 30% or 25% or 20%.

Preferably it is provided, particularly in mode A, that the lower threshold value depends on the detection threshold value and/or the nominal current strength IN and/or the circular current strength IK; and/or is greater than or equal to the detection threshold value; and/or is greater than the detection threshold value by at most a predetermined proportion, this proportion preferably being 5% or 7% or 10% or 12% or 15% or 20% or 25% or 30% or 35% or 40% or 45% or 50% or 60% or 80% or 100% or 120% or 150% or 200% or 250% or 300%; and/or is smaller than the upper threshold value; and/or is smaller than or equal to a predetermined proportion of the circular current strength IK, this proportion preferably being 60% or 50% or 40% or 30% or 25% or 20% or 17% or 15% or 12% or 11% or 10% or 7% or 5%;

is smaller than or equal to a predetermined proportion of the nominal current strength IN, this proportion preferably being 20% or 17% or 15% or 12% or 11% or 10% or 7% or 5% or 2% or 1%.

Preferably it is provided that in the case of a negative test result an appropriate emergency plan is executed, but otherwise switching over in accordance with the switching sequence plan is continued; or in the case of a positive test result switching over in accordance with the switching sequence plan is continued, but otherwise an appropriate emergency plan is executed.

If at least two test results are present, for example a test result from testing of the current i1 in the first main path and/or a test result from testing of the current i2 in the first transition path and/or a test result from testing the current i3 in the second transition path or through the first or second tap then preferably the appropriate emergency plan is executed if even only one of the test results should be negative and/or switching over in accordance with the switching sequence plan is continued as long as all test results are positive and/or not negative.

Preferably it is provided that in accordance with the emergency plan the switching steps previously run through in accordance with the switching sequence plan are performed in the reverse sequence; and/or the installation is separated from the alternating current mains; and/or a warning signal corresponding with the respective negative test result is generated.

In accordance with a third aspect the invention proposes an electrical installation constructed and/or intended and/or suitable for performing one of the proposed methods, comprising a control winding that is coupled to an alternating current mains with a predetermined period duration T, is designed for a predetermined nominal current strength IN and comprises a first and a second tap;

an on-load tap changer connected with the taps and comprising a load output line;

a first main path;

a first transition path;

a second transition path;

a second main path;

an isolating switching device so constructed that it can isolate and connect each main path and each transition path; and a control device coupled to the isolating switching device.

According to a fourth aspect the invention proposes an electrical installation that is constructed particularly in accordance with the third aspect, comprising a control winding that is coupled to an alternating current mains with a predetermined period duration T, is designed for a predetermined nominal current strength IN and comprises a first and a second tap;

an on-load tap changer connected with the taps and comprising a load output line;

a first main path;

a first transition path;

a second transition path;

a second main path;

an isolating switching device so constructed that it can isolate and connect each main path and each transition path; and a control device coupled to the isolating switching device; wherein the on-load tap changer is so constructed that for changing the active winding number of the control winding it can switch over in accordance with the predetermined switching sequence plan from a first continuous current state, in which a load current flows from the first tap to the load output line through the first main path and the second tap is separated from the load output line, to a second continuous current state, in which the load current flows from the second tap to the load output line through the second main path and the first tap is separated from the load output line;

the switching sequence plan prescribes that starting from a first continuous current state in a switching step a the first tap is or remains connected with the load output line through a first transition path and the first main path is isolated;

in a switching step a after switching step b the second tap is connected with the load output line through the second transition path so that a circular current iK flows through the transition paths due to the step voltage between the first and second taps;

in a switching step c after switching step b the first tap is separated from the load output line; and in a switching step d, after switching step c the second tap is connected with the load output line through the second main path;

the control device is so constructed that it can test at at least one predetermined test instant tT between switching step a and switching step c whether the first main path is isolated;

can detect a current strength IL of the load current; and can determine the test instant tT in dependence on the load current strength.

This installation is preferably constructed and/or intended and/or suitable for carrying out one of the proposed methods.

Each of these proposed installations can thus monitor correct isolation of the first main path.

Each of these proposed installations is preferably of symmetrical design so that in the case of switching over in the reverse direction, thus from the second to the first continuous current state, it can monitor correct isolation of the second main path in analogous manner.

Each of these proposed installations can be constructed in desired mode and manner according to need and, for example, comprise at least one or no additional control winding and/or at least one or no additional on-load tap changer and/or at least one main winding.

The load changeover switch can be constructed in desired mode and manner according to need and can comprise, for example, at least one current limiting element, that comprises, for example, at least one resistance and/or at least one choke.

Determination of the current strength is preferably carried out prior to switching step a.

For preference it is provided that the control device comprises a load current sensor that can detect the load current and generate a corresponding measurement signal and that is constructed in such a way that for determination of the load current strength IL it makes use of this measurement signal.

Preferably it is provided that the control device is so constructed that it can determine from this measurement signal the zero transitions of the load current and/or the first zero transition tN of the load currents since the start of the switching step a and/or the first zero transition tN of the load current since the start of the switching step b.

Preferably it is provided that the control device comprises a current sensor that can detect the current i1 flowing in the first main path and generate a corresponding measurement signal and that is so constructed that for testing it compares this measurement signal with a predetermined detection threshold value; and evaluates the test result as positive if the threshold value is fallen below and otherwise evaluates it as negative.

Preferably it is provided that the control device comprises a current sensor that can detect the current i2 flowing in the first transition path and generate an appropriate measurement signal and that is so constructed that in mode B for testing it compares this measurement signal with a predetermined lower circular current threshold value; and evaluates the test result as positive if the threshold value is exceeded and otherwise evaluates it as negative.

Preferably it is provided that the control device comprises a current sensor that can detect the current i3 flowing in the second transition path or through the first or second tap and generate an appropriate measurement signal and that is so constructed that in mode B for testing it compares this measurement signal with a predetermined upper circular current threshold value; and evaluates the test result as positive if the threshold value is fallen below and otherwise evaluates it as negative.

According to a fifth aspect the invention proposes an electrical installation that is constructed particularly in accordance with the third and/or fourth aspect, comprising a control winding that is coupled to an alternating current mains with a predetermined period duration T, is designed for a predetermined nominal current strength IN and comprises a first and a second tap;

an on-load tap changer connected with the taps and comprising a load output line;
a first main path;
a first transition path;
a second transition path;
a second main path;

an isolating switching device so constructed that it can isolate and connect each main path and each transition path; and a control device coupled to the isolating switching device (18);

wherein the on-load tap changer is so constructed that for changing the active winding number of the control winding it can switch over in accordance with the predetermined switching sequence plan from a first continuous current state, in which a load current flows from the first tap to the load output line through the first main path and the second tap is separated from the load output line, to a second continuous current state, in which the load current flows from the second tap to the load output line through the second main path and the first tap is separated from the load output line the switching sequence plan prescribes that starting from a first continuous current state in a switching step a the first tap is or remains connected with the load output line through the first transition path and the first main path is isolated;

in a switching step b after switching step a the second tap is connected with the load output line through the second transition path so that a circular current iK flows through the transition paths due to the step voltage between the first and second taps;

in a switching step c after switching step b the first transition path is isolated; and in a switching step d after switching step c the second tap is connected with the load output line through the second main path;

the control device is so constructed that it can test at at least one predetermined test instant tT between switching step c and switching step d whether the first main path is isolated;

can determine a current strength IL of the load current; and can determine the test instant tT in dependence on the load current strength.

This installation is preferably constructed and/or intended and/or suitable for carrying out one of the proposed methods.

Each of these proposed methods can thus monitor correct isolation of the first transition path.

Each of these proposed installations is preferably of symmetrical design so that in the case of switching over in the reverse direction, thus from the second to the first continuous current state, it can monitor correct isolation of the second transition path in analogous manner.

Separation of the first tap from the load output line is preferably carried out either in switching step c or between switching steps c and d.

Determination of the current strength IL is preferably carried out before switching step c.

Preferably it is provided that
the control device comprises a current sensor that can detect the current i2 flowing in the first transition path and generate a corresponding measurement signal and that is so constructed that for testing it
compares this measurement signal with a predetermined detection threshold value; and
evaluates the test result as positive if the threshold value is fallen below and otherwise evaluates it as negative.

Preferably it is provided that
the isolating switching device comprises
a first isolating switch arranged in the first main path;
a second isolating switch arranged in the first transition path;
a third isolating switch arranged in the second transition path; and
a fourth isolating switch arranged in the second main path.

The isolating switching device can be constructed in desired mode and manner according to need and comprise, for example, at least one isolating switch or no additional isolating switches.

Preferably it is provided that
the on-load tap changer comprises a direct drive for the isolating switches; and
the control device is coupled to the direct drive and so constructed that in accordance with the emergency plan it
can so control the direct drive that the switching steps previously run through in accordance with the switching sequence plan are performed in reverse sequence.

Preferably it is provided that
the direct drive comprises for each isolating switch an individual separate motor coupled to the respective isolating switch; or
the direct drive comprises for each at least two isolating switches a common control transmission coupled to the respective isolating switch and a common motor coupled to the respective common control transmission.

Preferably it is provided that
the direct drive comprises for each isolating switch an individual separate motor coupled to the respective isolating switch.

Preferably it is provided that
each separate motor is so coupled to the respective isolating switch that its movement directly and/or immediately and/or free of delay produces a movement and/or an actuation of this isolating switch.

Each coupling between a separate motor and the respective isolating switch can comprise, for example, at least one shaft and/or at least one transmission.

Preferably it is provided that
the direct drive comprises for each at least two isolating switches a common control transmission coupled to the respective isolating switches and a common motor coupled to the respective common control transmission.

Preferably it is provided that
each common control transmission is so coupled to the respective isolating switches that its movement directly and/or immediately and/or free of delay produces a movement and/or an actuation of this isolating switch; and/or
each common motor is so coupled to the respective common control transmission that its movement directly and/or immediately and/or free of delay produces a movement of this control transmission.

Each coupling between a common control transmission and the respective isolating switches and each coupling between a common motor and the respective common control transmission can comprise, for example, at least one shaft and/or at least one transmission. Each common control transmission usually comprises a cam disk that is driven by the respective common motor and whose cam is scanned by the respective isolating switches so that these are moved and/or actuated in a time sequence predetermined by the form of the cam.

A direct drive enables, in simple manner, a positive and negative acceleration of the movement of the associated isolating switches and control transmission up to the point of reversal of direction.

Preferably it is provided that
at least one of the isolating switches is formed as an oil switch or as a vacuum interrupter.

Preferably it is provided that
at least one of the current sensors comprises a saturation current transducer.

In each of the proposed methods and installations isolation of a path and/or opening of an isolating switch preferably takes place electrically.

Preferably it is provided that
the installation comprises a controllable or variable compensation choke for supply of inductive reactive power to the alternating current mains and/or for compensating for capacitive reactive power from the alternating current mains and the control winding forms at least a part of the compensation choke; and/or
the installation comprises a regulating transformer with a primary side and a secondary side and the control winding forms at least a part of the primary side or the secondary side.

The embodiments and explanations with respect to one of the aspects of the invention, particularly with respect to individual features of this aspect, also correspondingly apply in analogous manner to the other aspects of the invention.

BRIEF DESCRIPTION OF THE DRAWING

Embodiments of the invention are explained in the following through example on the basis of the accompany drawings. However, the individual features evident therefrom are not restricted to the individual embodiments, but can be connected and/or combined with further above-described individual features and/or with individual features of other embodiments. The details in the drawings are only explanatory and are not be regarded as limiting. The reference numerals present in the claims shall not restrict the scope of protection of the invention in any way, but merely refer to the embodiments shown in the drawings.

In the drawings:

FIG. 2 shows the on-load tap changer of FIG. 1 in a first transition phase after a switching step a;

SPECIFIC DESCRIPTION OF THE INVENTION

Figure 1:
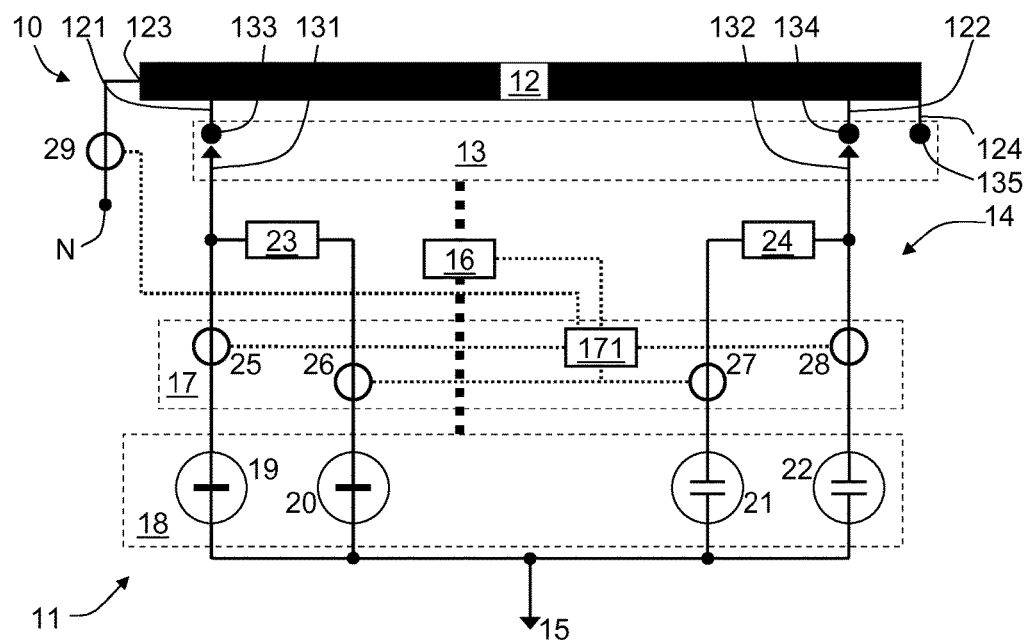
FIG. 1 shows a first embodiment of an electrical installation with a first embodiment of an on-load tap changer in a first continuous current state.

A first embodiment of an electrical installation 10 that forms, for example, a controllable compensation choke for providing and/or supplying reactive power in a three-phase alternating current mains (not illustrated) and for compensation for capacitive reactive current from the alternating current mains, is schematically illustrated in FIG. 1. The alternating current mains has, for example, a mains frequency of 50 Hz and thus a period duration T=20 ms.

In this embodiment the installation 10 comprises, for each phase U, V, W of the alternating current mains, an on-load tap changer 11 that is constructed in accordance with a first embodiment, and a control winding 12, only the part of the installation 10 intended for one phase U being illustrated. The control winding 12 comprises a plurality of taps, of which only a first tap 121 and a second tap 122 are illustrated, as well as a first winding end 123, connected with a mains line N of the alternating current mains, and a second winding end 124, and is designed for a predetermined nominal current strength IN. If required, at least one main winding (not illustrated) and/or at least one additional control winding (not illustrated) can be connected between the first winding end 123 and mains line N. The second winding end 124 is constructed as, for example, a third tap, but if required it can also be connected with a star point or with a corner point of a delta connection.

The on-load tap changer 11 comprises a selector 13 with two moved contacts 131, 132 and three fixed contacts 133, 134, 135, a load changeover switch 14, connected with the selector 13, a load output line 15, connected with the load changeover switch 14, a direct drive 16 for the selector 13 and load changeover switch 14 and a control device 17 that is constructed in accordance with a first embodiment, with a control unit 171 connected with the direct drive 16. The first fixed contact 133 is connected with the first tap 121, the second fixed contact 134 is connected with the second tap 122 and the third fixed contact 135 is connected with the third tap or the second winding end 124. The moved contacts 131, 132 here contact, for example, the first tap 121 and second tap 122, respectively, but each moved contact 131, 132 can also be selectably moved with the help of the direct drive 16 to the third tap 124 or one of the remaining taps and contact this. The load output line 15 is, for example, connected with ground, but if required it can also be connected with ground potential or with the star point or with the corner point of a delta connection or with a load output line (not illustrated) that is associated with the phase V of the installation 10, and/or with the load output line (not illustrated) that is associated with the phase W of the installation 10, or with a load output line (not illustrated) of an additional on-load tap changer (not illustrated) that is associated with the phase U of the installation 10 and connected with an additional control winding (not illustrated).

In this embodiment of the on-load tap changer 11 the load changeover switch 14 comprises an isolating switching device 18 with four isolating switches or vacuum interrupters 19, 20, 21, 22 that are actuated by the direct drive 16, and two transition resistances 23, 24. The vacuum interrupters 19 to 22 and the transition resistances 23, 24 are distributed symmetrically to two branches. The first branch comprises a parallel circuit of the first vacuum interrupter 19 and a first series circuit of the first transition resistance 23 and the second vacuum interrupter 20 and the second branch comprises a parallel circuit of the fourth vacuum interrupter 22 and a second series circuit of the second transition resistance 24 and the third vacuum interrupter 21. In the first branch the first vacuum interrupter 19 forms a first main path and the first series circuit 20/23 forms a first transition path. In the second branch the fourth vacuum interrupter 22 forms a second main path and the second series circuit 21/24 forms a second transition path.

The isolating switching device 18 is so constructed that it can selectably isolate or connect each main path and each transition path with the help of the vacuum interrupters 19 to 22 actuated by the direct drive 16.

The on-load tap changer 11 is so constructed that for changing the active winding number of the control winding 12, thus for changing the part of the control winding 12 conducting a load current iL, it can switch over in accordance with a predetermined switching sequence plan from a first continuous current state, in which the load current iL flows from the first tap 121 to the load output line 15 via the first main path and the second tap 122 is separated from the load output line 15, to a second continuous current state, in which the load current flows from the second tap 122 to the load output line 15 via the second main path and the first tap 121 is separated from the load output line 15.

In this embodiment the control device 17 comprises, for each isolating switch, a current sensor 25, 26, 27, 28, each constructed as a saturation current transducer, as well as a load current sensor 29 that is constructed as a saturation current transducer. The first current sensor 25 is seated on a line to the first isolating switch 19 and can detect the current i1 flowing in the first main path and generate a corresponding first measurement signal. The second current sensor 26 is seated on a line to the second isolating switch 20 and can detect the current i2 flowing through the first transition path and generate a corresponding second measurement signal. The third current sensor 27 is seated on a line to the third isolating switch 21 and can detect the current i3 flowing in the second transition path and generate a corresponding third measurement signal. The fourth current sensor 28 is seated on a line to the fourth isolating switch 22 and can detect the current i4 flowing in the second main path and generate a corresponding fourth measurement signal. The load current sensor 29 is seated on the line between winding end 123 of mains line N and can detect the load current iL flowing through the control winding 12 and generate a corresponding fifth measurement signal.

FIG. 1 shows the on-load tap changer 11 in a first continuous current state in which a load current iL flows from the mains line N to the first tap 121 and from there further through the first main path to the load output line 15 and the second tap 122 is separated from the load output line. For that purpose the first vacuum interrupter 19 is closed and the third and fourth vacuum interrupters 21, 22 opened. In this embodiment of the on-load tap changer 11 the first tap 121 is, through example, additionally connected through the first transition path with the load output line 15. For that purpose the second vacuum interrupter 20 is closed. However, it is also possible for the second vacuum interrupter 20 to be opened so that the first tap 121 is not connected with the load output line 15 through the first transition path.

The on-load tap changer 11 is so constructed that for changing the active winding number of the control winding 12 it can switch over from the first continuous current state to a second continuous current state in accordance with a predetermined switching sequence plan. In the second continuous current state the load current iL flows from the mains line N to the second tap 122 and from there onward via the second main path to the load output line 15 and the first tap 121 is separated from the load output line. For that purpose the fourth vacuum interrupter 22 is closed and the first and second vacuum interrupters 19, 20 are opened. In this embodiment of the on-load tap changer 11 the second tap 122 is, through example, additionally connected with the load output line 15 via the second transition path. For that purpose the third vacuum interrupter 21 is closed. However, it is also possible that the third vacuum interrupter 21 is not, so that the second tap 122 is not connected with the load output line 15 through the second transition path.

Figure 2:
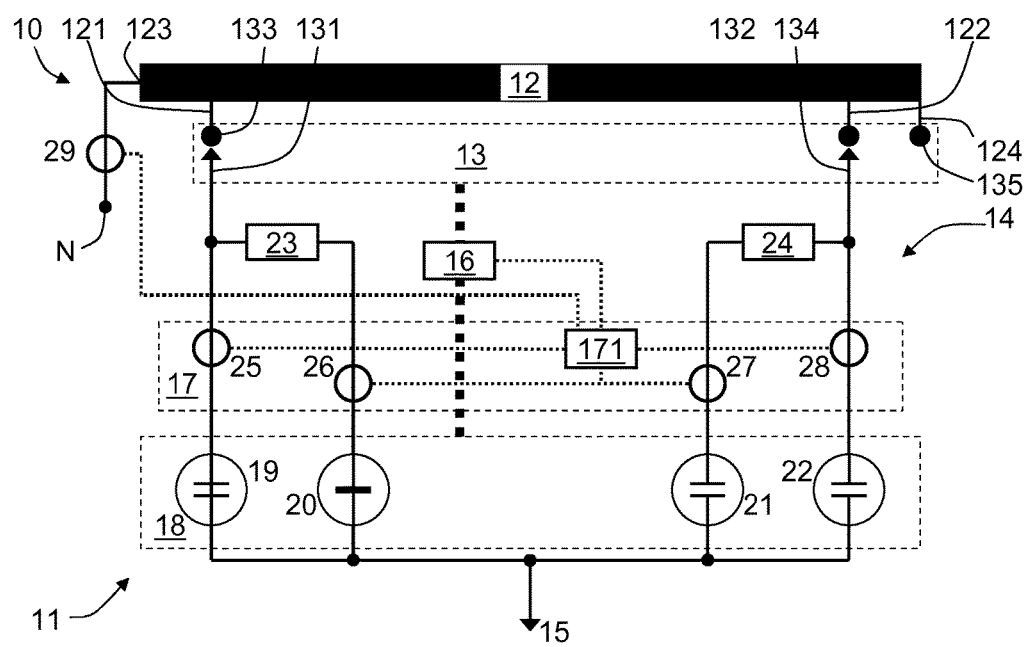

This switching sequence plan is described in the following:

In FIG. 2 the on-load tap changer 11 is illustrated in a first transition phase after a switching step a. The switching sequence plan prescribes that starting from the first continuous current state in this switching step the first tap 121 remains connected through the first transition path with the load output line 15—or is connected if it was separated in the first continuous current state—and the first main path is isolated.

Figure 3:
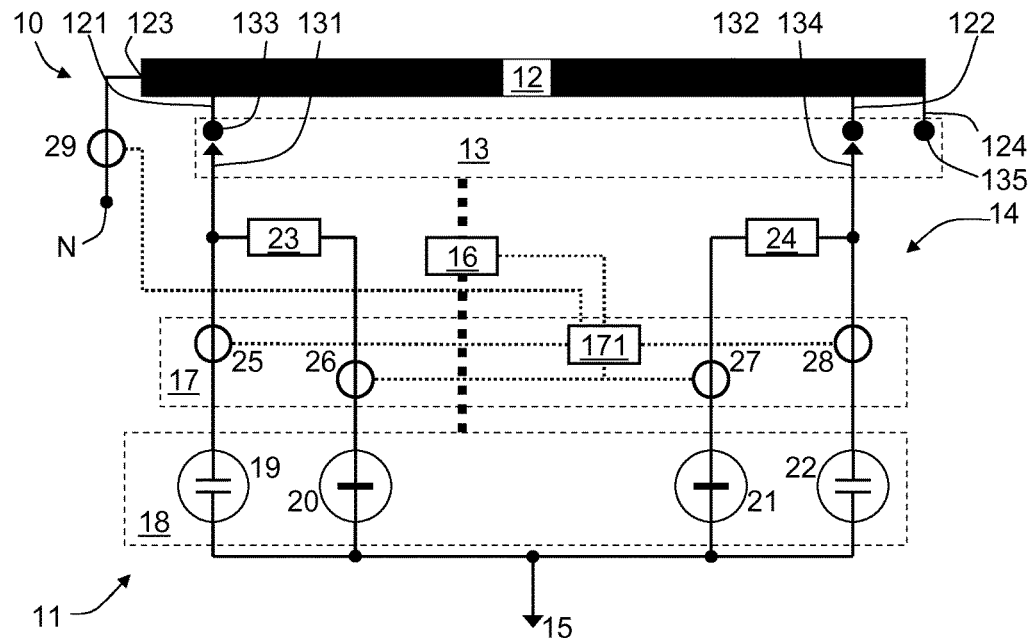
FIG. 3 shows the on-load tap changer of FIG. 1 in a second transition phase after a switching step b.

In FIG. 3 the on-load tap changer 11 is illustrated in a second transition phase after a switching step b. The switching sequence plan prescribes that, after switching step a, in this switching step the second tap 122 is connected through the second transition path with the load output line so that by virtue of the step voltage between the first and the second taps 121, 122 a circular current iK flows through the transition paths.

Figure 4:
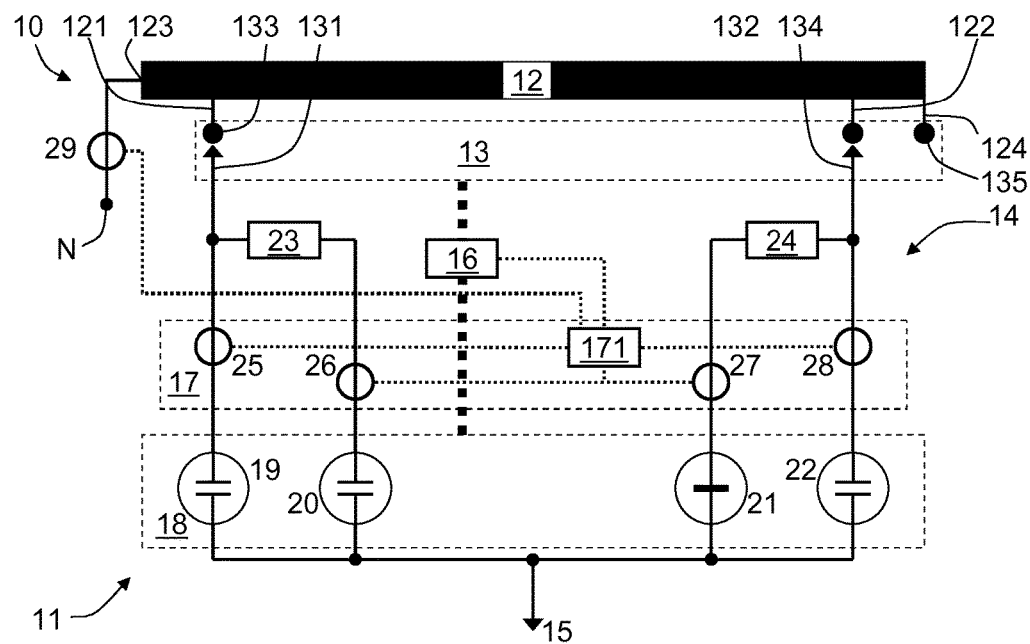
FIG. 4 shows the on-load tap changer of FIG. 1 in a third transition phase after a switching step c.

In FIG. 4 the on-load tap changer 11 is illustrated in a third transition phase after a switching step c. The switching sequence plan prescribes that after switching step b the first tap 121 is separated from the load output line in this switching step.

Figure 5:
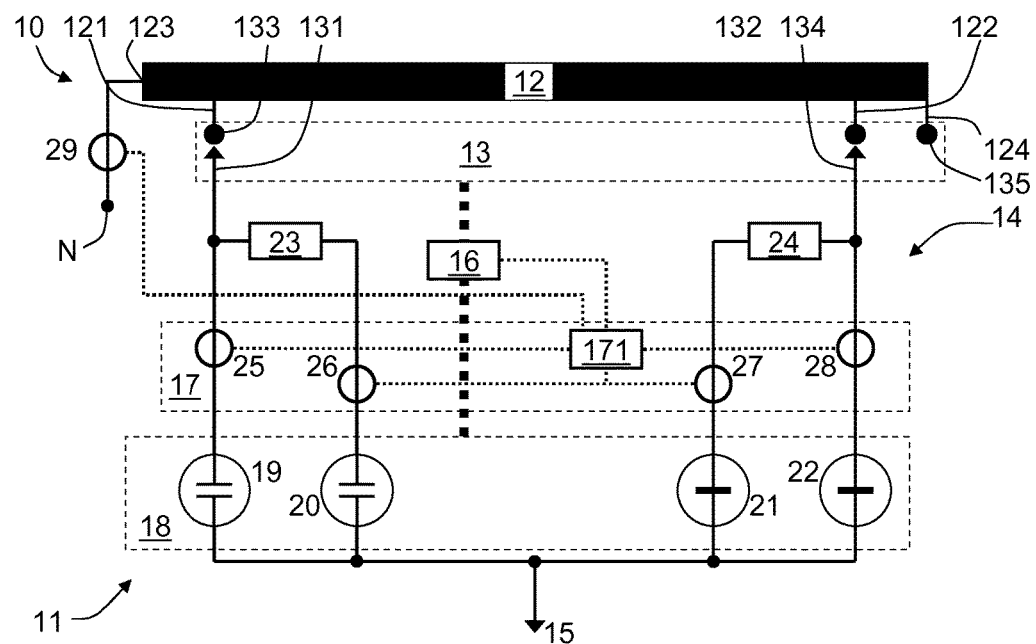
FIG. 5 shows the on-load tap changer of FIG. 1 in a second continuous current state after a switching step d.

In FIG. 5 the on-load tap changer 11 is illustrated in the second continuous current state after a switching step d. The switching sequence plan prescribes that after switching step d in this switching step the second tap 122 is connected with the load output line through the second main path.

The control device 17 is so constructed in this embodiment that with the help of the control unit 171 it can predetermine a test instant tT between switching step a and switching step c and can test at least at this test instant tT whether the first main path is isolated;

can determine a first current strength IL of the load current iL;

can determine this test instant tT in dependence on the load current strength IL;

for determining the load current strength iL forms, for example, the effective value from the fifth measurement signal of the load current sensor 29;

can determine from the fifth measurement signal the zero transitions of the load current iL and the first zero transition tN of the load current iL since the start to of the switching step a and the first zero transition tN of the load current iL since the start tb of the switching step b;

in the case of a positive test result continues the switching over in accordance with the switching sequence plan and otherwise executes an emergency plan;

according to the emergency plan:

controls the direct drive in such a way that the switching steps previously run through in accordance with the switching sequence plan are executed in reverse sequence;

prior to the testing, can compare the load current strength IL with a predetermined mode threshold value SM and in the case of falling below, thus if the load current strength IL is less than the mode threshold value SM, performs the testing in accordance with a mode B and otherwise in accordance with a mode A;

predetermines a delay time TV and places the test instant tT ahead of the switching step b and by the delay time TV after the start ta of the switching step a;

can predetermine a test interval TT extending from the first zero transition tN of the load current since the start ta of the switching step a up to the test instant tT and performs the testing at the test interval TT.

The test instant tT and the delay time TV thus depend on the first zero transition tN of the load current since the start ta of the switching step a.

In this embodiment the control device 17 is so constructed that it, with the help of the control unit 171, in mode A for testing compares the first measurement signal of the first current sensor 25 with a predetermined detection threshold value SE and in the case of falling below, thus if this measurement signal is less than the detection threshold value SE, evaluates the test result as positive and otherwise as negative;

prior to the testing predetermines a lower threshold value SU, compares the load current strength IL with the lower threshold value SU and in the case of falling below, thus if the load current strength is greater than the lower threshold value SU, performs the testing and otherwise executes an emergency plan;

predetermines an upper threshold value SO, compares the load current strength IL with the upper threshold value SO and in the case of falling below, thus if the load current strength is greater than the upper threshold value SO, sets the delay time tV to a predetermined value TV1 and otherwise to a predetermined value TV2>TV1;

can predetermine a first time buffer TY1 and a second time buffer TY2>TY1, wherein TV1=T/2+D1, in which D1=DT+TY1, and TV2=T/2+D2, in which D2=DT+TY2 and DT is the duration of the isolation.

The delay time TV thus depends on the load current strength IL in antitonic manner.

TV1 and TV2 thus depend on the isolating duration DT in proportional manner. For example:
DT=1.5 ms, TY1=0 ms, TY2=2.5 ms, D1=1.5 ms, D2=4 ms, TV1=11.5 ms, TV2=14 ms.

The mode threshold value SM is, for example 30% of the nominal current strength IN. The detection threshold value SE is, for example, 20% of the nominal current strength IN. The upper threshold value SO is, for example, 70% of the nominal current strength IN. The lower threshold value SU is, for example, 30% of the nominal current strength IN and is thus equal to the mode threshold value SM.

In this embodiment the control device 17 is so constructed that it, with the help of the control unit 171, in the mode B
for testing
predetermines a lower circular current threshold value SKU, compares the second measurement signal of the second current sensor 26 with the lower circular current threshold value SKU and in the case of exceeding, thus if this measurement signal is greater than the lower circular current threshold value SKU, evaluates the test result as positive and otherwise as negative;
predetermines an upper circular current threshold value SKO, compares the third measurement signal of the third current sensor 27 with the upper circular current threshold value SKO and in the case of falling below, thus if this measurement signal is less than the upper circular current threshold value SKO, evaluates the test result as positive and otherwise as negative;
predetermines a delay time TV and places the test time instant tT by the delay time TV after the start tb of the switching step b.

The lower circular threshold value SKU is, for example, 40% of the nominal current strength IN. The upper circular current threshold value SKO is, for example, 80% of the nominal current strength IN and is thus greater than the lower circular current threshold value SKU.

In this embodiment the control device 17 is so constructed that with the help of the control unit 171 it
can predetermine a test instant tT between switching step c and switching step d and can test at least at this test instant tT whether the first transition path is isolated;
can determine this test instant tT in dependence on the load current strength IL;
for testing
compares the second measurement signal of the second current sensor 26 with the detection threshold value SE and in the case of falling below, thus if this measurement signal is less than the detection threshold value SE, evaluates the test result as positive and otherwise as negative.

Figure 6:
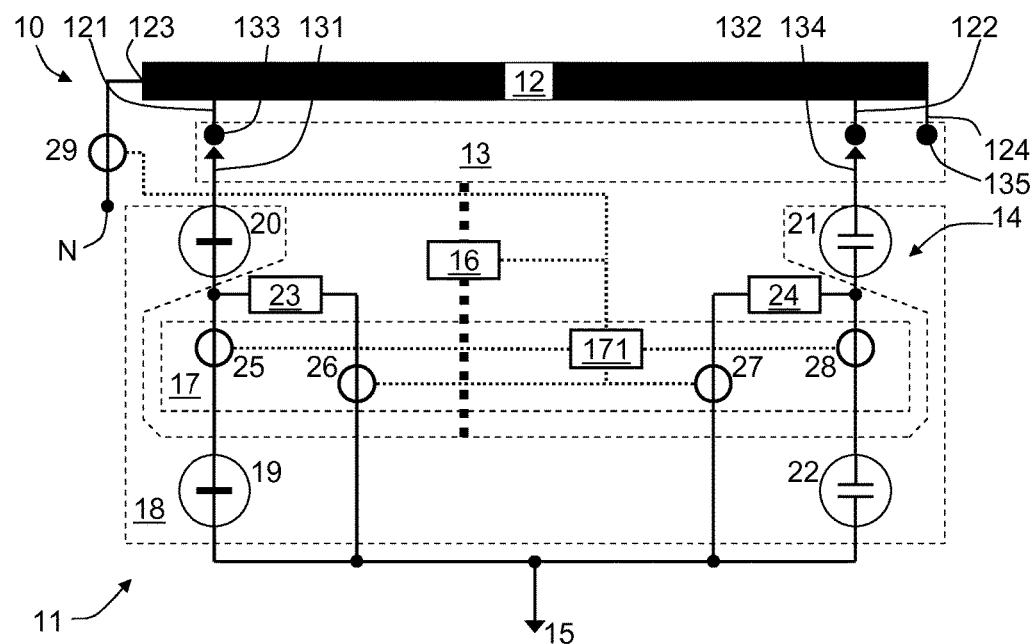
FIG. 6 shows a second embodiment of an electrical installation with a second embodiment of an on-load tap changer in a first continuous current state.

A second embodiment of the installation 10 is schematically illustrated in FIG. 6. This embodiment is similar to the first embodiment so that in the following primarily the differences are explained in more detail.

In this embodiment the on-load tap changer 11 is constructed in accordance with a second embodiment that is similar to the first embodiment so that in the following primarily the differences are explained in more detail.

In this embodiment of the on-load tap changer 11 the first and second vacuum interrupters 19, 20 of the first branch and the third and fourth vacuum interrupter 21, 22 of the second branch are respectively connected in series. The first transition resistance 23 of the first branch is connected between the second vacuum interrupter 20 and first current sensor 25, and the second transition resistance 24 of the second branch is connected between the third vacuum interrupter 21 and fourth current sensor 28.

In the first branch the first and second vacuum interrupters 19, 20 form the first main path and the second vacuum interrupter 20 and the first transition resistance 23 form the first transition path. In the second branch the third and fourth vacuum interrupters 21, 22 form the second main path and the third vacuum interrupter 21 and the second transition resistance 24 form the second transition path.

The switching sequence plan described in connection with the first embodiment of the installation 10 also applies analogously to this embodiment of the installation 10.

Figure 7:
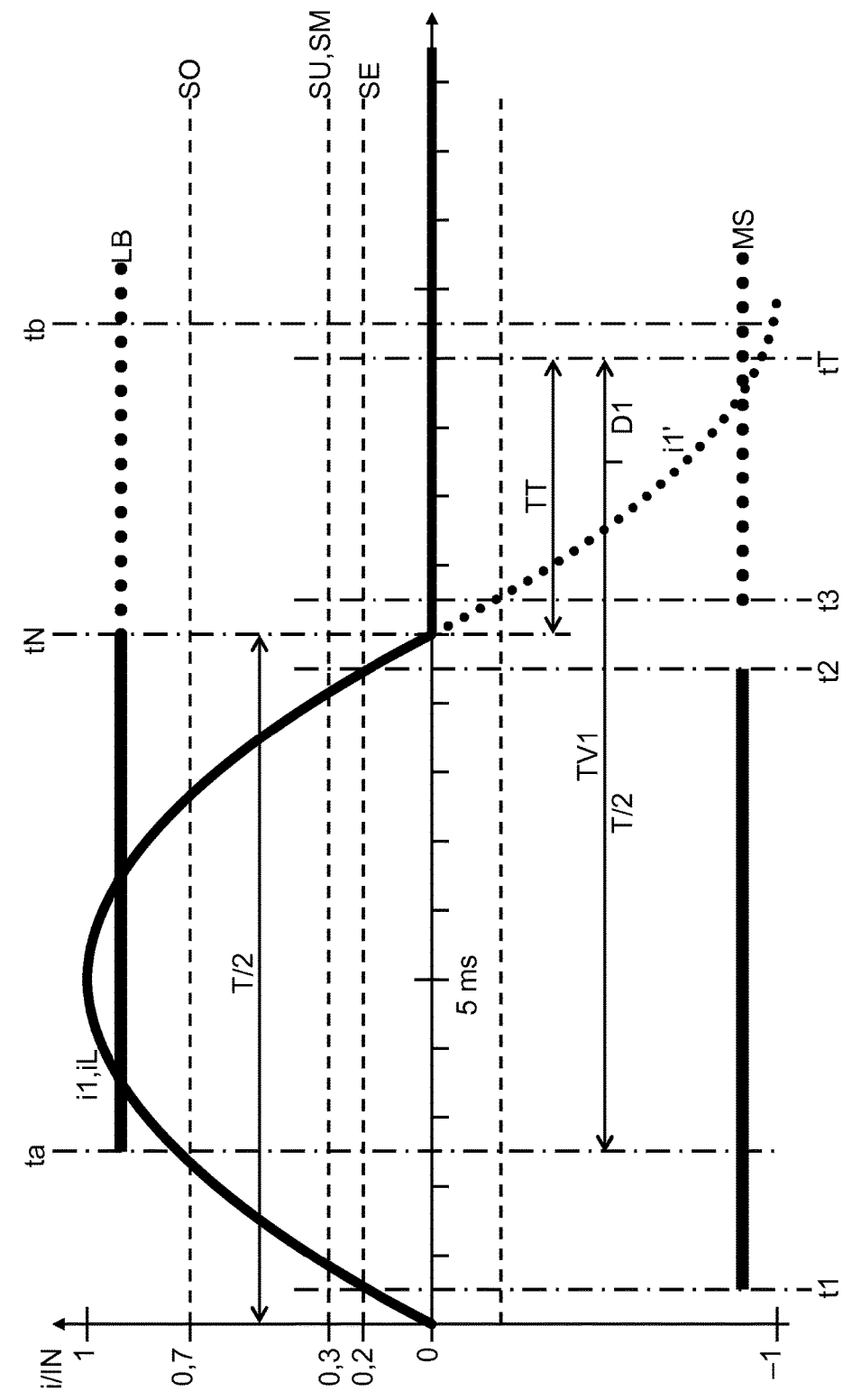
FIG. 7 is a diagram with the time plot of the current in a first main path of a first phase with large load current.

FIG. 7 is a diagram with the time plot of the current i1 through the first vacuum interrupter 19 in the first main path of the phase U with large load current iL, wherein SO<IL.

Since the installation 10 in the first and second embodiments forms a controllable or variable compensation choke for supply of inductive reactive power to the alternating current mains and/or for compensation for capacitive reactive power from the alternating current mains the control device 17 in this embodiment comprises, for example, a reactive power regulator (not illustrated) whose task is to set the reactive power that is to be supplied by the compensating choke or installation 10 and/or for which compensation is to be provided, and/or to keep the reactive power of the alternating current mains in a predetermined reactive power band.

If, for example, the reactive power regulator recognizes that the reactive power of the alternating current mains departs from the reactive power band, then the control device 17 generates a corresponding switching signal for switching over from the first continuous current state, in which the installation 10 or the on-load tap changer 11 is instantaneously disposed, to a second continuous current state that is suitable for returning the reactive power of the alternating current mains to the reactive power band. After the control device 17 has generated this switching signal, it executes the method that is explained further above and that is in accordance with the invention or is proposed, for changing the active winding number of the control winding 12.

Initially, the control device 17 determines the load current strength IL of the load current iL, compares this with the mode threshold value SM and if the threshold value is fallen below performs the testing in accordance with mode B and otherwise in accordance with mode A.

Since the load current iL is large, SO<IL and SM<SO and consequently SM £ IL, so that the control device 17 selects mode A.

The switching step a is executed at instant ta, the switching step b at the instant tb and the testing at the test instant tT. In the normal case, an arc in the first vacuum interrupter 19 opened in switching step a at the outset does not represent a fault and is illustrated by the line LB, the current i1 continuing to flow substantially unchanged through the first main path. The first measurement signal of the first current sensor 25 is illustrated by the line MS, at the instant t1 the current i1 exceeds the detection threshold value SE and at the instant t2 the current i1 exceeds the detection threshold value SE, so that this measurement signal MS is OFF prior to t1, is ON between t1 and t2, and is OFF again after t2. In the normal case the arc LB extinguishes at the first zero transition tN since ta, so that this measurement signal MS from tN is again OFF. In the case of a fault, thus if the first vacuum interrupter 19 has not correctly opened, the arc LB does not extinguish at the zero transition tN, illustrated by the dotted line LB, so that the current i1 continues to flow, illustrated by the dotted line i1', and this measurement signal MS is ON, illustrated by the dotted line MS.

For the current i1, between ta and tN in the normal case i1=iL and from tN in the normal case i1=0, illustrated by the thick continuous line i1, and from tN in the fault case i1'=iL, illustrated by the thick dotted line i1'.

According to mode A the control device 17 tests within the time interval TT whether the current i1 falls below the detection threshold value SE. For that purpose it tests whether the first measurement signal MS is OFF or ON and it recognizes at the earliest at the instant t3 and at the latest at the instant tt whether this measurement signal MS during the time interval TT was constantly OFF in correspondence with the normal case or was at least once ON in correspondence with the fault case.

Figure 8:
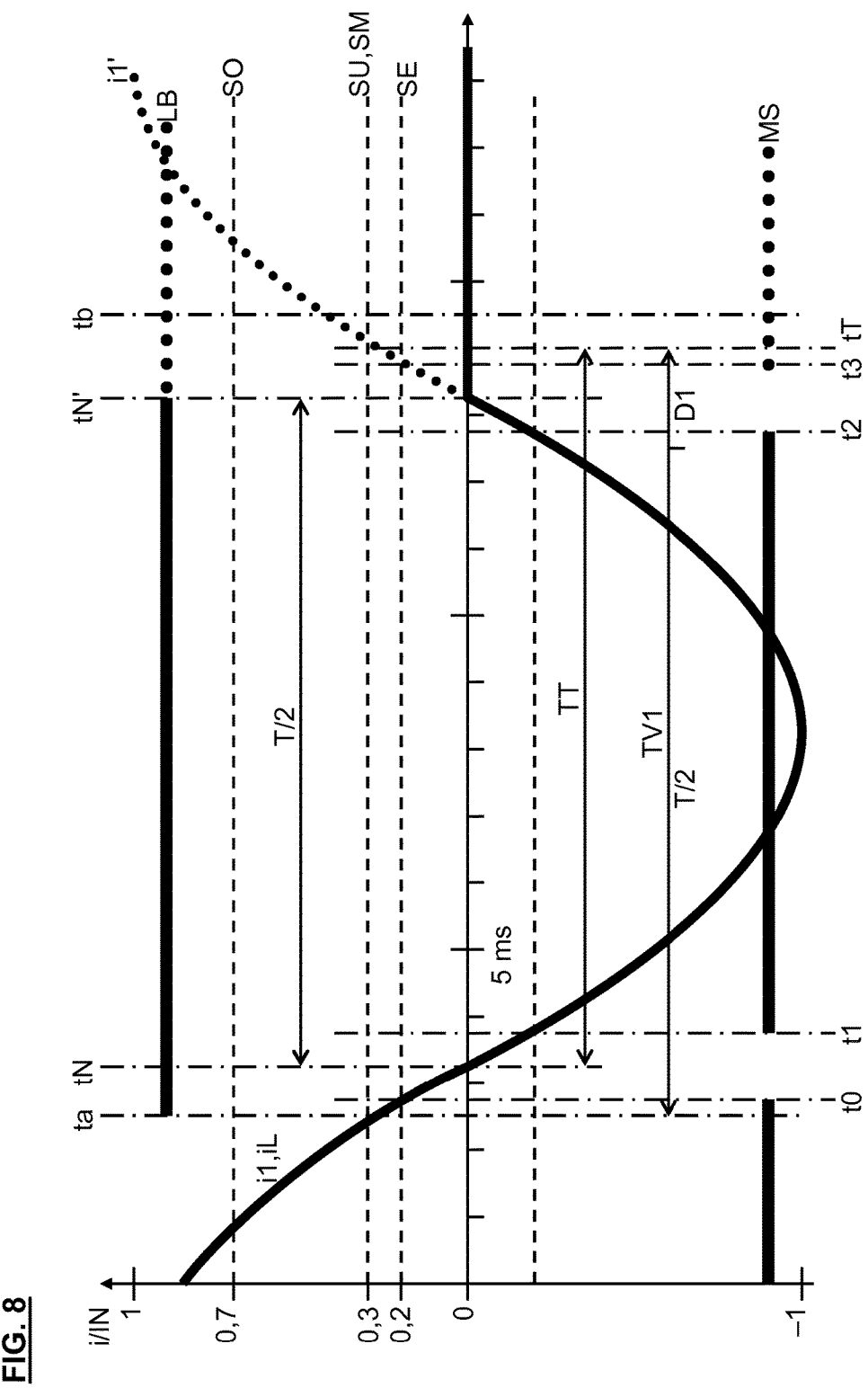
FIG. 8 is a diagram similar to FIG. 7 for a second phase displaced by 120° with respect to the first phase.

FIG. 8 is a diagram corresponding with FIG. 7 with the time plot of the current i1 through the first vacuum interrupter 19 in the first main path of the phase V that is displaced by 120° relative the phase U, at large load current IL.

For monitoring the first vacuum interrupter 19 the control device 17 selects the test instant tT in such a way that it lies at a predetermined delay time TV=TV1 after the start ta of the switching step a. In that case, it is taken into consideration that sufficient time remains for evaluation of the corresponding first measurement signal also in phase V, in which the arc LB in the normal case with correct opening of the corresponding first vacuum interrupter is extinguished later than in the phase U.

Since ta lies so closely in front of tN that the first vacuum interrupter 19 at TN is still not completely opened, the arc LB even in the normal case cannot extinguish at the instant tN, but only at the next zero transition with respect to the time instant tN'.

For the current i1, between ta and tN' in the normal case i1=iL and from tN' in the normal case i1=0, illustrated by the thick continuous line i1, and from tN' in the fault case i1'=iL, illustrated by the thick dotted line i1'.

Figure 9:
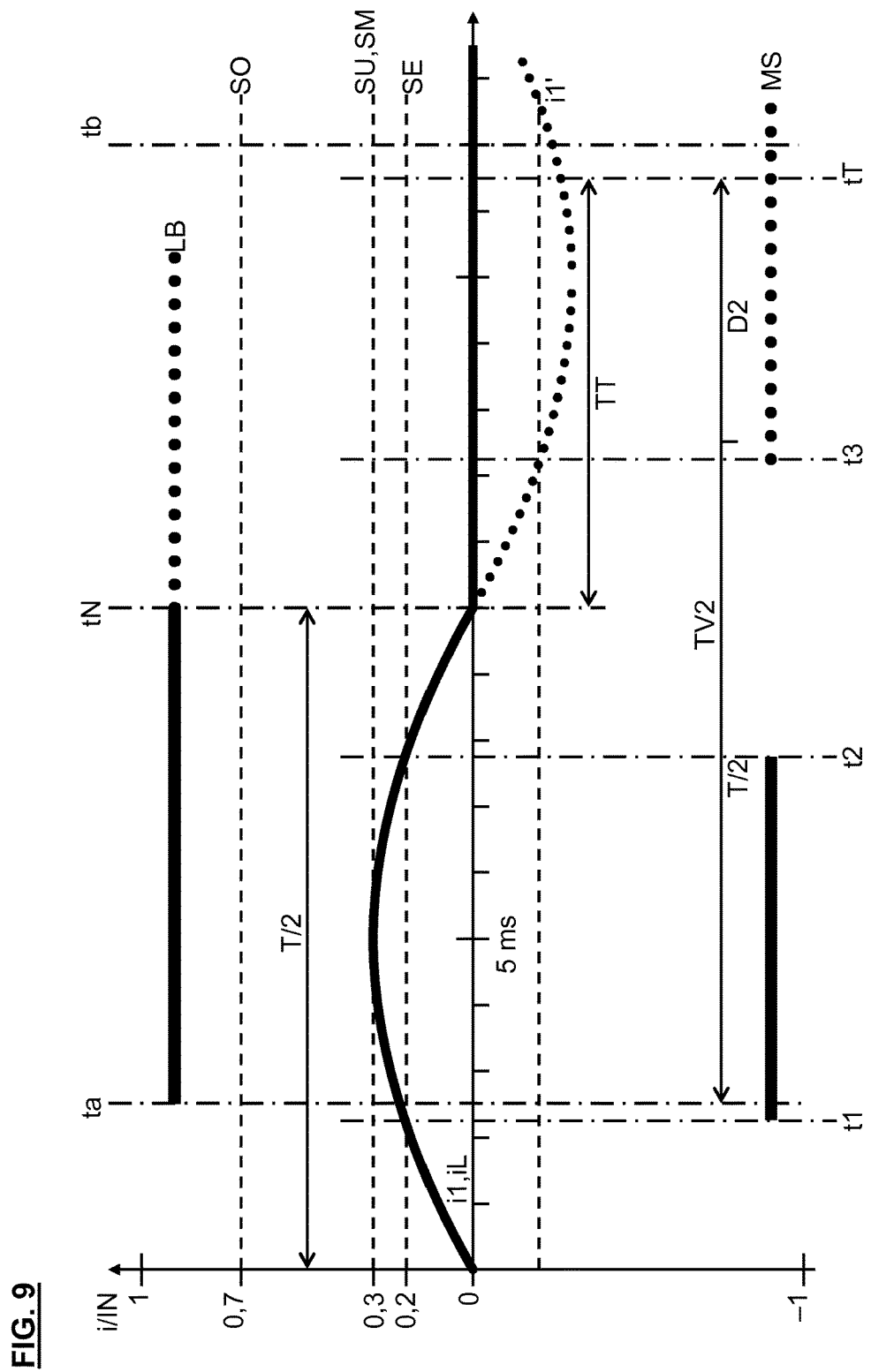
FIG. 9 is a diagram similar to FIG. 7 with medium-size load current.

FIG. 9 is a diagram corresponding with FIG. 7 with the time plot of the current i1 of the phase U with medium-size load current iL, wherein SU £ IL £ SO.

Since the load current iL is of medium size, SU £ iL £ SO and SM=SU and consequently SM £ IL, so that the control device 17 selects mode A.

Since this medium-size load current iL is less than the large load current iL of FIGS. 7 and 8, the time interval between t1 and t2 is greater than the corresponding time interval for the large load current iL. The load current strength IL can therefore be determined from the length of this time interval.

Figure 10:
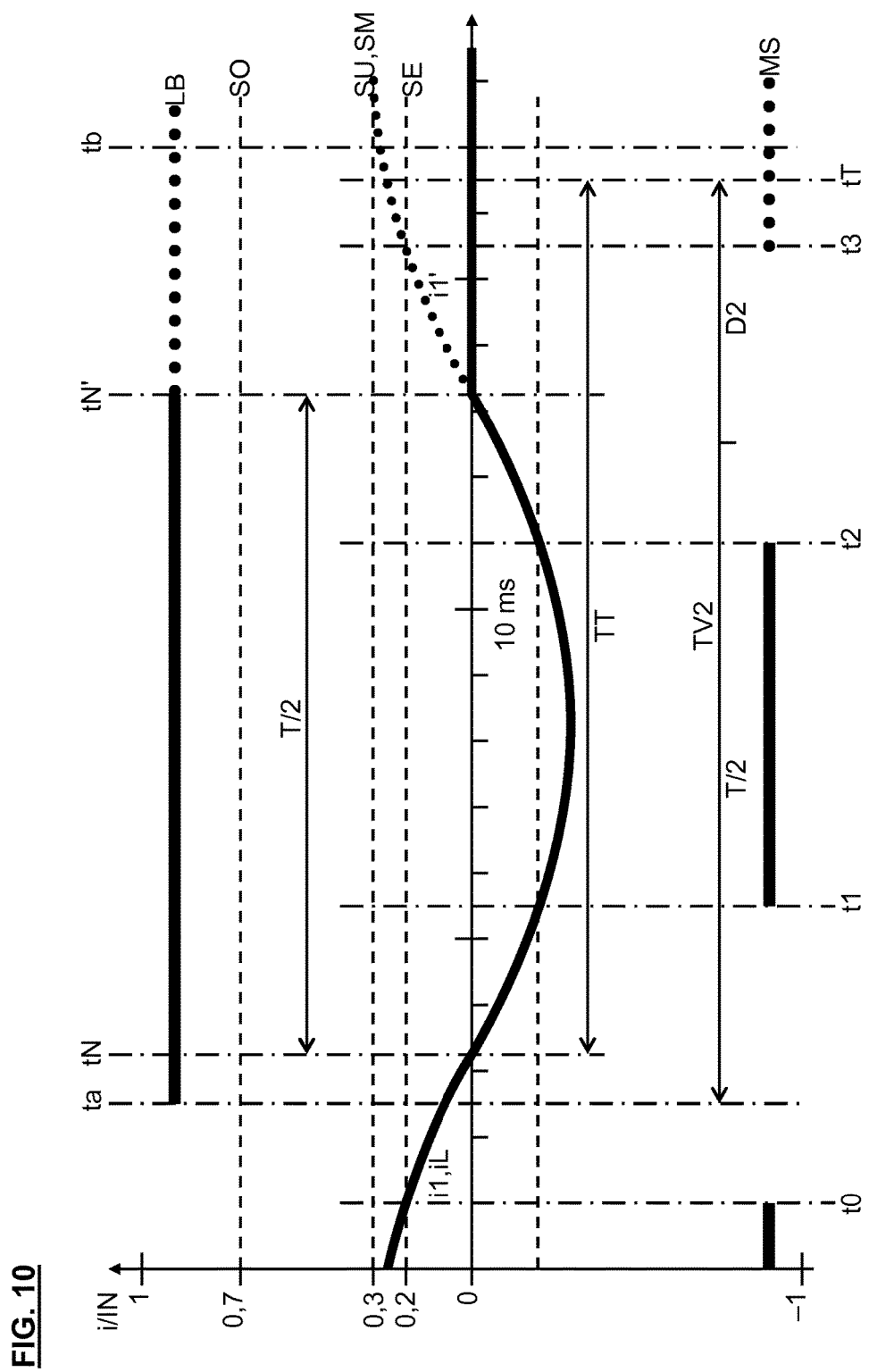
FIG. 10 is a diagram similar to FIG. 9 for a second phase displaced by 120° with respect to the first phase.

FIG. 10 is a diagram corresponding with FIG. 9 with the time plot of the current i1 of the phase V for medium-size load current iL.

In this medium-size load current the control device 17 predetermines the delay time TV=TV2 that is greater than for the large load current. For that purpose, for example, it controls the direct drive 16 in such a way that the speed thereof is reduced by comparison with the large load current.

Figure 11:
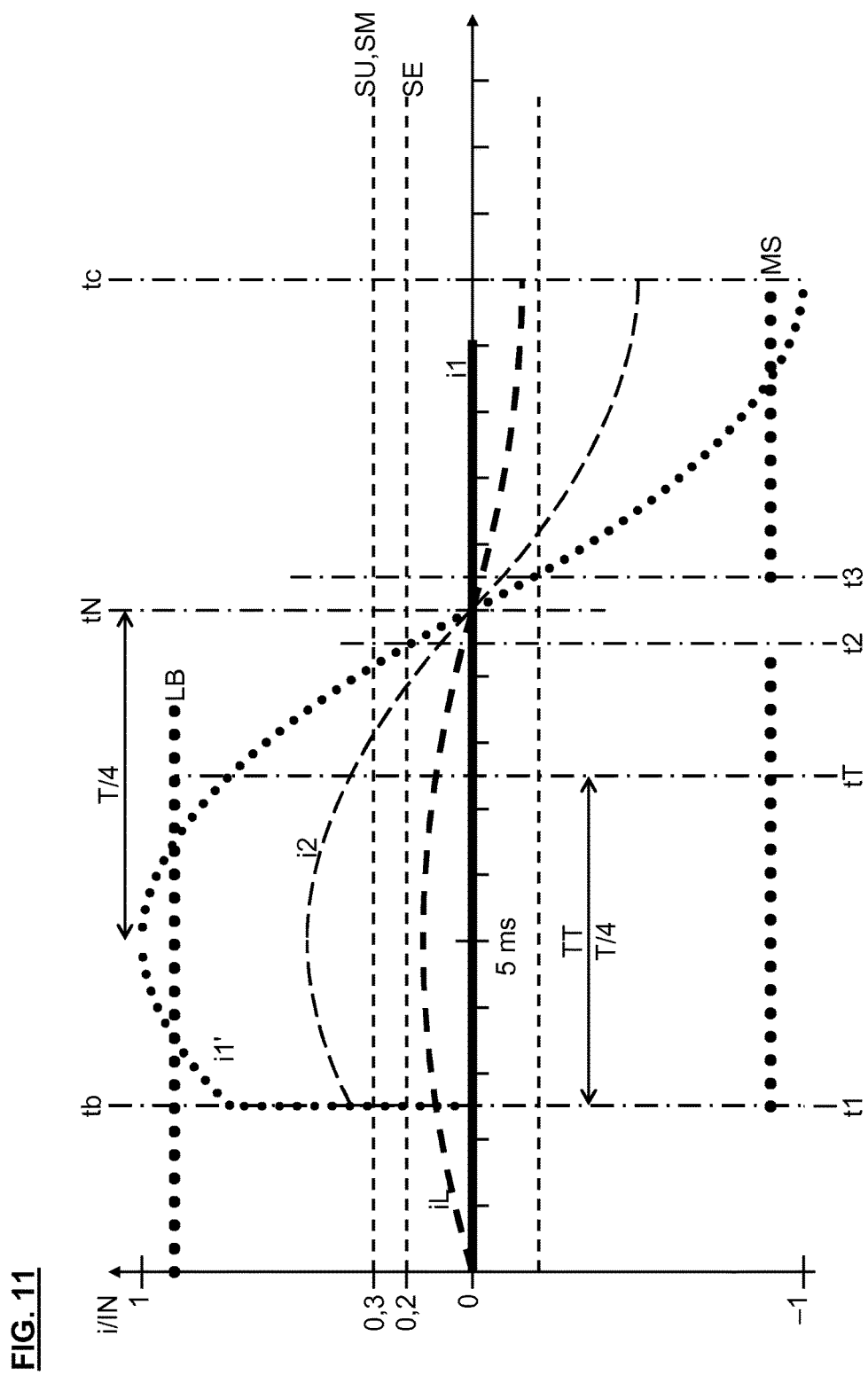
FIG. 11 is a diagram similar to FIG. 7 with small load current.

FIG. 11 is a diagram corresponding with FIG. 7 with the time plot of the current i1 of the phase U and with the time plot of the current i2 through the second vacuum interrupter 20 in the first transition path of the phase U for small load current iL, wherein IL<SU=SM.

Since the load current iL is small, iL<SU and SM=SU and consequently IL<SM, so that the control device 17 selects mode B.

In the case of this small load current iL the testing according to mode A is not possible as for the large and medium-size load current iL according to FIGS. 7 to 10, since the load current iL never exceeds the detection threshold value SE with certainty and in reliably detectable manner. Consequently, not only in the normal case, but also in the fault case the first measurement signal MS is OFF up to the time instant t1.

At the instant tb in the normal case with correct opening of the first vacuum interrupter 19 in switching step a and with correct closing of the second vacuum interrupter 20 in switching step b, a circular current iK flows through the first fixed contact 133, the first transition path with the second vacuum interrupter 20, the second transition path with the third vacuum interrupter 21 and the second fixed contact 134, additionally the load current iL flows through the first fixed contact 133, the first transition path with the second vacuum interrupter 20 and the load output line 15, and no current flows through the first main path with the first vacuum interrupter 19; cf. FIG. 3. Consequently, for the current i2 through the first transition path, i2=iK+iL, illustrated by the thin dashed line, for the current i3 that flows through the second transition path and the third vacuum interrupter 21, i3=iK (FIG. 13), and for the current i1 through the first main path, i1=0.

In the event of a fault, thus if the first vacuum interrupter 19 has not correctly opened in switching step a, the arc LB does not extinguish at the zero transition tN, so that the first transition path with the first transition resistance 23 is bridged over by the first main path that is almost without resistance, and the circular current iK now flows with double current strength compared with the normal case through the first main path and the second transition path with the second transition resistance 24. In addition, the load current iL now flows significantly more strongly than in the normal case through the first main path, so that for the current i1' through the first main path in the fault case—illustrated by the dotted line i1'—there applies approximately i1'=2×i2 and for the current i3' through the second transition path in the fault case (illustrated in FIG. 13 by the dotted line i3') there applies i3'=2×iK. Since the load current iL is small, wherein IL<SU, it cannot—even in the least favorable case—compensate for the circular current iK to such an extent that in the fault case i1'<SU or even i1'<SE. This current i1' is accordingly so strong that it exceeds the detection threshold value SE with certainty and in reliably detectable manner, so that this measurement signal MS, illustrated by the dotted line MS, between t1 and t2, thus prior to the first zero transition tN since tb, and from t3, thus after tN, is ON.

For the current i1, from tb in the normal case i1=0, illustrated by the thick continuous line i1, and in the fault case approximately i1'=2×i2, illustrated by the thick dotted line i1'.

According to mode B and in accordance with a first variant the control device 17 tests between switching steps b and c within the time interval TT that begins at the instant tb, whether the current i1 falls below the detection threshold value SE. For that purpose it tests whether the first measurement signal MS is OFF or ON and in the case of a fault it recognizes at the earliest at instant t1 and at the latest at instant tt whether this measurement signal MS during the time interval TT was constantly OFF in correspondence with the normal case or was at least once ON in correspondence with the fault case.

In that case, the control device 17 has selected, for the time interval TT, the value TT=T/4.

Figure 12:
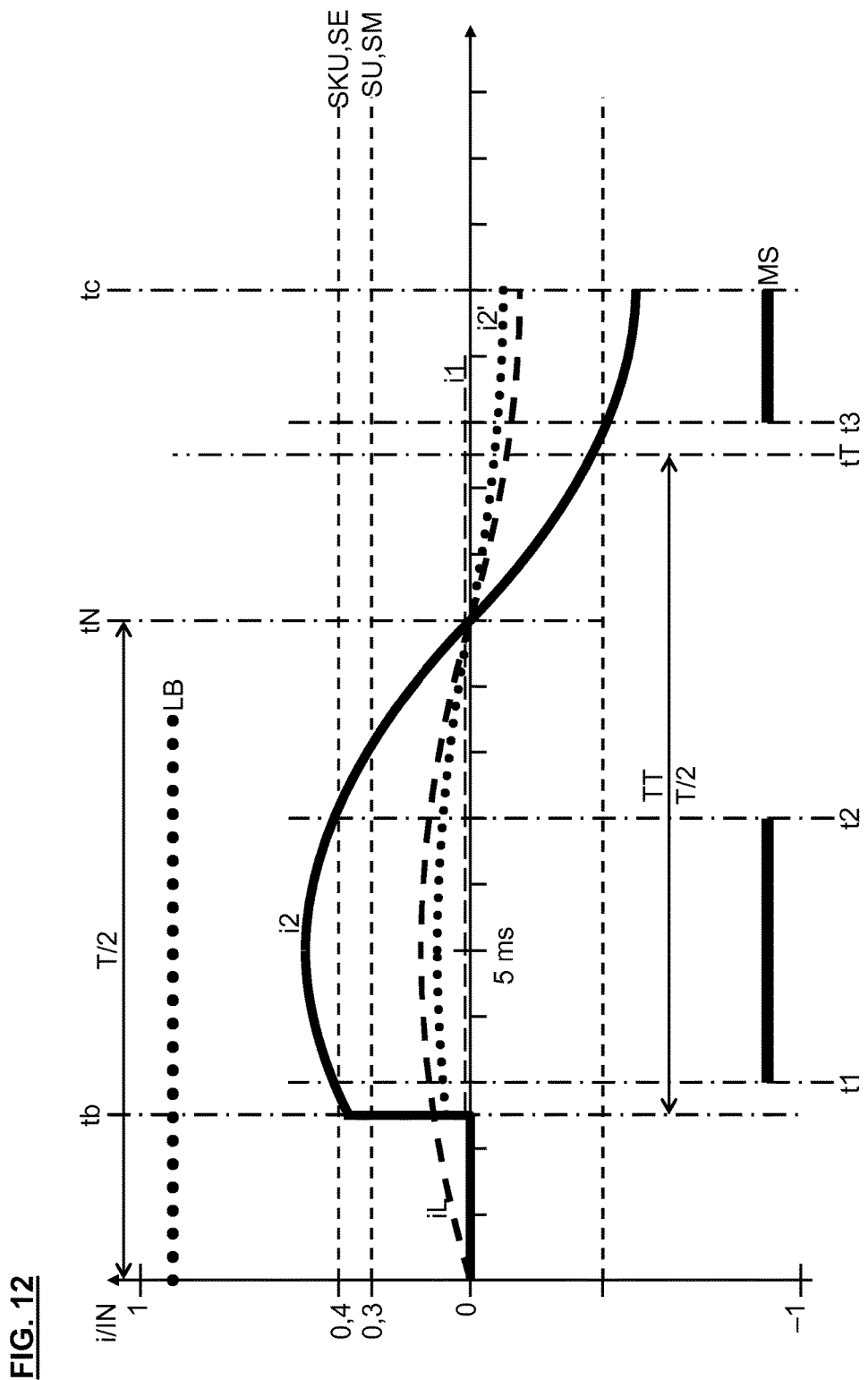
FIG. 12 is a diagram similar to FIG. 11 with the time plot of the current in a first transition path.

FIG. 12 is a diagram corresponding with FIG. 11 with the time plot of the current i2 of the phase U at small load current iL.

For the current i2, between tb and tc in the normal case i2=iK, illustrated by the thick continuous line i2, and in the fault case approximately i2'<iL, illustrated by the thick dotted line i2'.

According to mode B and in accordance with a second variant the control device 17 tests between switching steps b and c within the time interval TT that begins at the time instant tb, whether the current i2 exceeds the lower circular current threshold value SKU. For that purpose it tests whether the second measurement signal MS of the second current sensor 26 is ON or OFF and it recognizes at the earliest at the instant t1 and at the latest at the instant tt whether this measurement signal MS during the time interval TT was at least once ON in correspondence with the normal case or constantly OFF in correspondence with the fault case.

The control device 17 has in that case selected, for the time interval TT, the value TT=T/2 and, for the detection threshold value SE of the second current sensor 26, the value SE=SKU.

Figure 13:
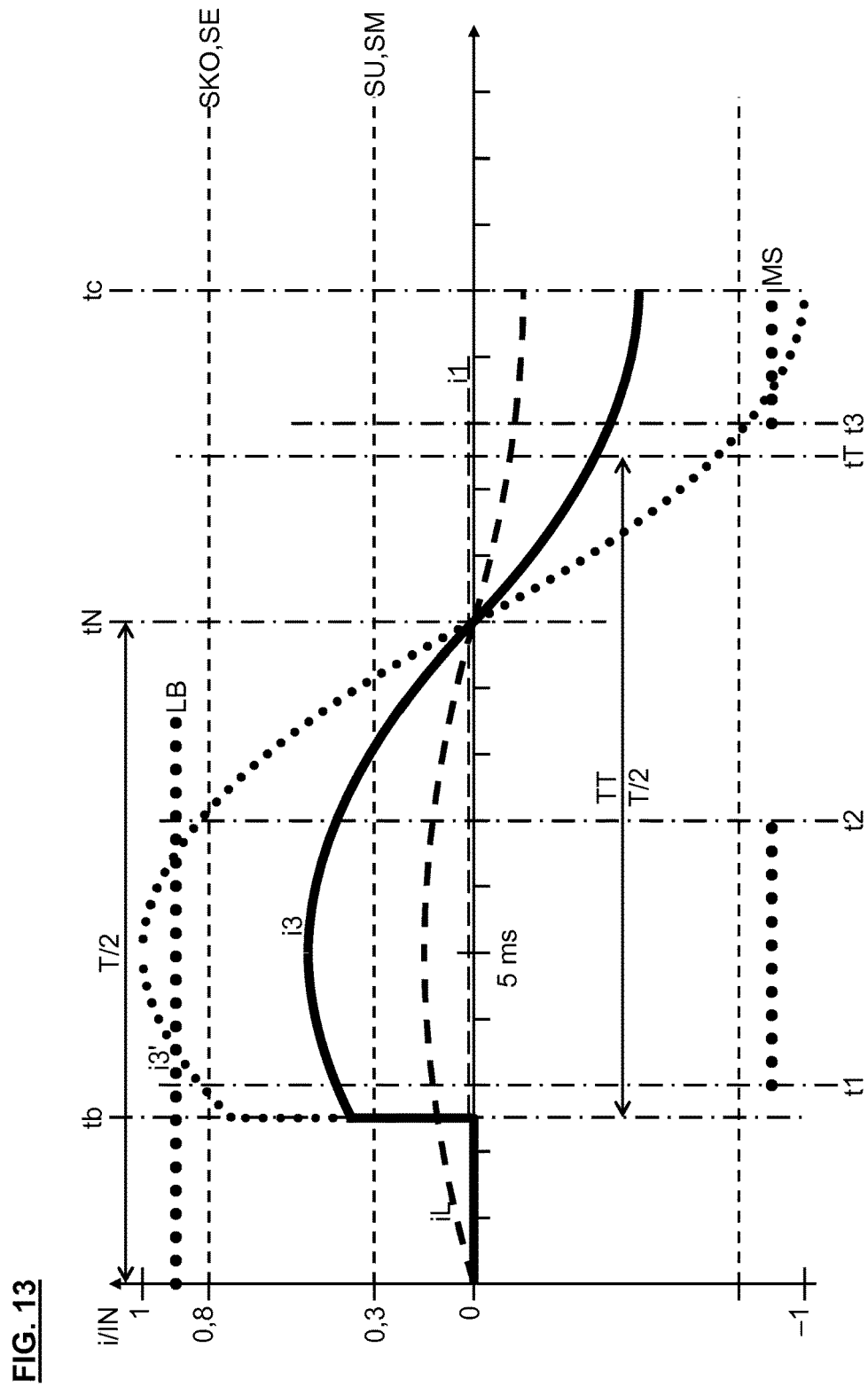
FIG. 13 is a diagram similar to FIG. 11 with the time plot of the current in a second transition path.

FIG. 13 is a diagram corresponding with FIG. 12 with the time plot of the current i3 of the phase U for small load current iL.

For the current i3, between tb and tc in the normal case i3=iK, illustrated by the thick continuous line i3, and in the fault case i3'=2×iK, illustrated by the thick dotted line i3'.

According to mode B and in accordance with a third variant the control device 17 tests between switching steps b and c within the time interval TT that begins at the time instant tb, whether the current i3 falls below the upper circular current threshold value SKO. For that purpose it tests whether the third measurement signal MS of the third current sensor 27 is OFF or ON and it recognizes at the earliest at the instant t1 and at the latest at the instant tt whether this measurement signal MS during the time interval TT was constantly OFF in correspondence with the normal case or at least once ON in correspondence with the fault case.

The control device 17 has in that case selected, for the time interval TT, the value TT=T/2 and, for the detection threshold value SE of the third current sensor 27, the value SE=SKO.

Figure 14:
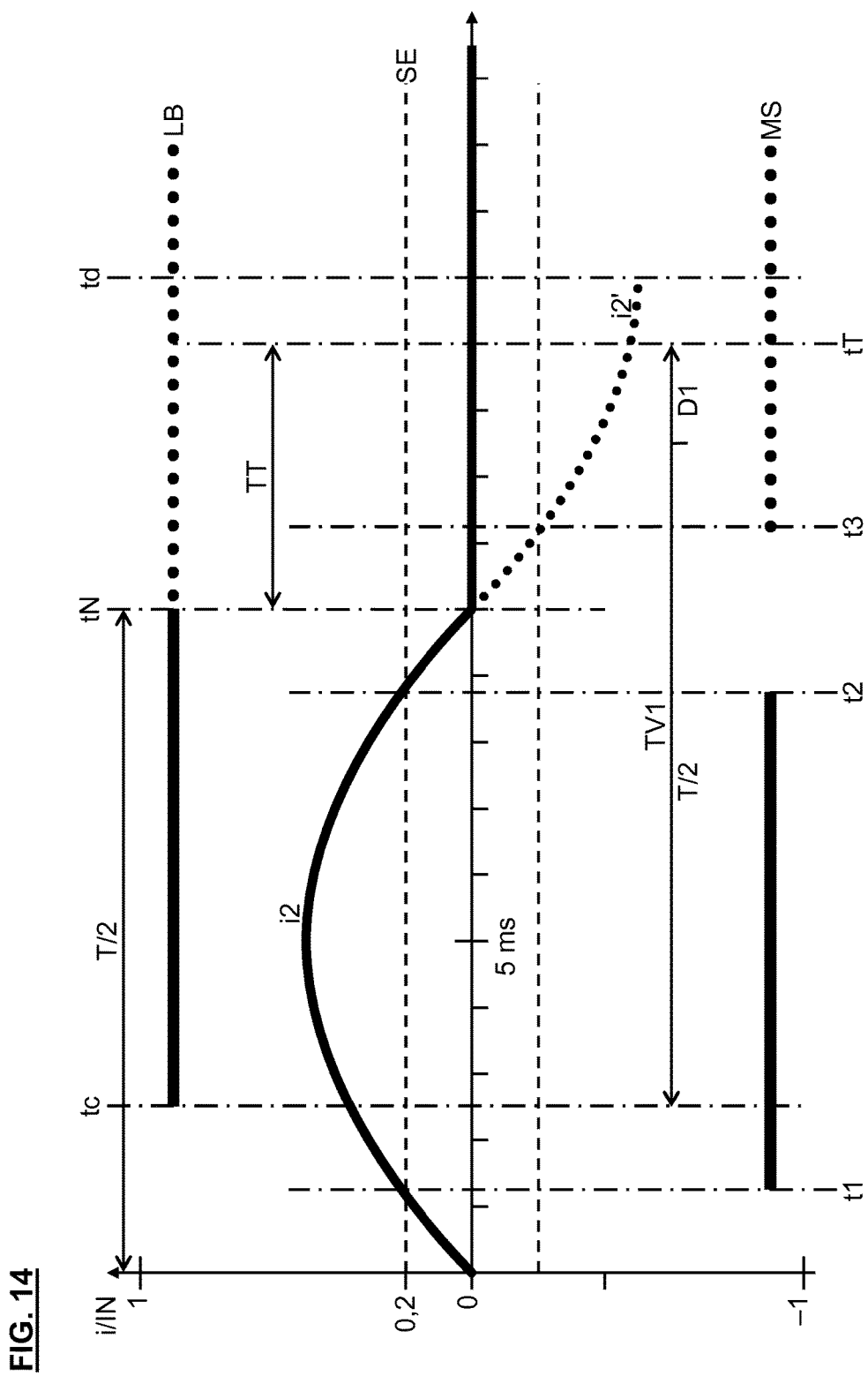
FIG. 14 is a diagram similar to FIG. 7 with the time plot of the current in the first transition path of the first phase.

FIG. 14 is a diagram corresponding with FIG. 7 with the time plot of the current i2 of the phase U for large load current iL.

For monitoring the second vacuum interrupter 20 the control device 17 selects the test instant tT in such a way that it lies at a predetermined delay time TV=TV1 after the start tc of the switching step c. In that case it is taken into consideration that sufficient time for evaluation of the second measurement signal remains also in phase V in which the arc LB in the case of correct opening of the corresponding second vacuum interrupter 20 is extinguished later than in the phase U.

For the current i2, between to and tN in the normal case i2=iK+iL and, from tN in the normal case i2=0, illustrated by the thick continuous line i2, and, from tN in the fault case i2'=iK+iL, illustrated by the thick dotted line i2'.

The control device 17 tests within the time interval TT whether the current i2 falls below the detection threshold value SE. For that purpose it tests whether the second measurement signal MS is OFF or ON and it recognizes at the earliest at the instant t3 and at the latest at the instant tt whether this measurement signal MS during the time interval TT was constantly OFF in correspondence with the normal case or was at least once ON in correspondence with the fault case.

The invention claimed is:

1. A method of changing an active winding number of a control winding in an electrical installation, wherein
the control winding is coupled to an alternating current mains having a predetermined period duration, the control winding being designed for a predetermined nominal current strength and comprises a first and a second tap;
switching, in accordance with a predetermined switching sequence plan from a first continuous current state to a second continuous current state, a load current flowing in the first continuous current state from the first tap to a load output line through a first main path with the second tap isolated from the load output line, the load current flowing in the second continuous current state from the second tap to the load output line through a second main path with the first tap isolated from the load output line; and
the predetermined switching sequence plan comprising the steps wherein:
in a first switching step starting from the first continuous current state, the first tap is or remains connected with the load output line through a first transition path and the first main path is isolated;
in a second switching step after the first switching step, the second tap is connected with the load output line through a second transition path so that a circular current flows through the transition paths due to a step voltage between the first and second taps;
in a third switching step after the second switching step, the first tap is isolated from the load output line; and
in a fourth switching step after the third switching step, the second tap is connected with the load output line through the second main path;
at at least one predetermined test instant between the first switching step and the third switching step, testing whether the first main path is isolated;
a current strength of the load current is determined; and wherein
the test instant depends on the load current strength.

2. The method according to claim 1, wherein testing whether the first main path is isolated comprises the steps of:
detecting the current flowing in the first main path and comparing it with a predetermined detection threshold value and generating a test result; and
evaluating the test result as positive when it is below the predetermined detected threshold value and otherwise evaluating the test result as negative.

3. The method according to claim 1, wherein the test instant is at a predetermined delay time after the start of the first switching step.

4. The method according to claim 1, wherein
prior to testing whether the first main path is isolated, the load current strength is compared with a predetermined mode threshold value; and
the testing whether the first main path is isolated is carried out in accordance with a first mode if the load current strength is greater than the mode threshold value and otherwise the testing whether the first main path is isolated is carried out in accordance with a second mode.

5. The method according to claim 4, wherein in the second mode the test instant is after the second switching step; and the testing whether the first main path is isolated comprises the steps of:
  detecting a current flowing in the first transition path and comparing it with a predetermined lower circular current threshold value; and
  evaluating the test result as positive if the current flowing in the first transition path is greater than the predetermined lower circular current threshold value and otherwise evaluating the test result as negative.

6. The method according to claim 5, wherein the testing whether the first main path is isolated comprises the steps of:
  detecting a current flowing in the second transition path or through the first or second tap and comparing it with a predetermined upper circular current threshold value;
  evaluating the test result as positive if the current flowing in the second transition path or through the first or second tap is less than the upper predetermined circular current threshold value and otherwise evaluating the test result as negative.

7. The method according to claim 6, wherein the test instant is at a predetermined delay time after the start of the second switching step.

8. The method according to claim 1, wherein
  the testing whether the first main path is isolated is carried out during a test time interval extending from a first zero transition of the load current since the start of the first switching step to the test instant; or
  the testing whether the first main path is isolated is carried out after the first zero transition of the load current since the start of the first switching step and up to the test instant.

9. The method according to claim 1, wherein the predetermined switching sequence plan comprises the steps wherein
  in the first switching step the first main path is isolated by opening a first isolating switch in the first main path; or
  in the third switching step the first tap is isolated from the load output line in that the first transition path is isolated by opening a second isolating switch in the first transition path; or
  during or after the fourth switching step the second continuous current state is reached;
  the testing of the first main path is carried out by determining whether the first isolating switch is opened; or
  the testing of the first transition path is carried out by determining whether the second isolating switch is opened; or
  at least one of the isolating switches is formed as an oil switch or as a vacuum interrupter;
  at least one of the isolating switches is actuated by a direct drive.

10. The method according to claim 1, further comprising the steps of:
  comparing the load current strength with a predetermined upper threshold value; and
  if the predetermined upper threshold value is exceeded a delay time is set to a first predetermined value and otherwise to a second predetermined value greater than the first predetermined value.

11. An electrical installation comprising:
  a control winding coupled to an alternating current mains having a predetermined period duration designed for a predetermined nominal current strength, and comprising a first and a second tap;
  an on-load tap changer connected with the first and second taps and comprising a load output line;
  a first main path;
  a first transition path;
  a second transition path;
  a second main path;
  an isolating switching device configured to isolate the first and second main paths from the load output line, to isolate the first or the second transition path from the load output line, and to connect the first or the second transition path to the load output line; and
  a control device coupled to the isolating switching device;
  wherein, for changing an active winding number of the control winding, the on-load tap changer switches in accordance with a predetermined switching sequence plan in which
    in a first continuous current state a load current flows from the first tap to the load output line through the first main path and the second tap is isolated from the load output line, and
    in a second continuous current state the load current flows from the second tap to the load output line through the second main path and the first tap is isolated from the load output line;
  the predetermined switching sequence plan comprises the steps of:
    in a first switching step starting from the first continuous current state, the first tap is or remains connected with the load output line through a first transition path and the first main path is isolated;
    in a second switching step after the first switching step, the second tap is connected with the load output line through the first and second transition paths so that a circular current flows through the transition paths due to a step voltage between the first and second taps;
    in a third switching step after the second switching step, the first tap is isolated from the load output line; and
    in a fourth switching step after the third switching step, the second tap is connected with the load output line through the second main path;
  the control device is configured to
    determine at at least one predetermined test instant between the first switching step and the third switching step whether the first main path is isolated;
    detect a current strength of the load current; and
    determine the test instant in dependence on the load current strength.

12. An electrical installation comprising
  a control winding coupled to an alternating current mains having a predetermined period duration, designed for a predetermined nominal current strength, and comprising a first and a second tap;
  an on-load tap changer connected with the first and second taps and comprising
  a load output line;
  a first main path;
  a first transition path;
  a second transition path;
  a second main path;
  an isolating switching device configured to isolate the first and second main paths from the load output line and to connect the first or the second transition path; and
  a control device coupled to the isolating switching device;
  wherein
    for changing an active winding number of the control winding, the on-load tap changer switches in accordance with a predetermined switching sequence plan from a first continuous current state in which a load current flows from the first tap to the load output line through the first main path and the second tap is isolated from the load output line to a second continuous current state in which the load current flows from the second tap to the load output line through the second main path and the first tap is isolated from the load output line;

the predetermined switching sequence comprises the steps in which:

in a first switching step starting from the first continuous current state, the first tap is or remains connected with the load output line through the first transition path and the first main path is isolated;

in a second switching step after the first switching step, the second tap is connected with the load output line through the second transition path so that a circular current flows through the first and second transition paths due to a step voltage between the first and second taps;

in a third switching step after the second switching step, the first transition path is isolated; and in a fourth switching step after the third switching step, the second tap is connected with the load output line through the second main path;

the control device is configured to determine at at least one predetermined test instant between the third switching step and the fourth switching step whether the first main path is isolated;

determine a current strength of the load current; and determine the test time instant in dependence on the load current strength.

13. The electrical installation according to claim 12, wherein the electrical installation comprises a controllable or variable compensation choke for supplying inductive reactive current to the alternating current mains or for compensating for capacitive reactive current from the alternating current mains and the control winding forms at least a part of the compensation choke; or the electrical installation comprises a regulating transformer with a primary side and a secondary side and the control winding forms at least a part of the primary side or the secondary side.

\* \* \* \* \*